(12) United States Patent
Antonelli et al.

(10) Patent No.: US 10,901,241 B1
(45) Date of Patent: Jan. 26, 2021

(54) OPTICAL METROLOGY SYSTEM USING INFRARED WAVELENGTHS

(71) Applicant: ONTO INNOVATION INC., Wilmington, MA (US)

(72) Inventors: George Andrew Antonelli, Portland, OR (US); Troy Daniel Ribaudo, Portland, CA (US)

(73) Assignee: Onto Innovation Inc., Wilmington, MA (US)

(*) Notice: Subject to any disclaimer, the term of this patent is extended or adjusted under 35 U.S.C. 154(b) by 31 days.

(21) Appl. No.: 16/352,716

(22) Filed: Mar. 13, 2019

Related U.S. Application Data

(60) Provisional application No. 62/642,889, filed on Mar. 14, 2018, provisional application No. 62/738,716, filed on Sep. 28, 2018.

(51) Int. Cl.
| | | |
|---|---|---|
| *G01B 11/06* | (2006.01) | |
| *G02F 1/01* | (2006.01) | |
| *H01S 5/34* | (2006.01) | |

(52) U.S. Cl.
CPC ........ *G02F 1/0136* (2013.01); *G01B 11/0641* (2013.01); *G01B 2210/56* (2013.01); *G02F 2203/05* (2013.01); *G02F 2203/50* (2013.01); *H01S 5/3402* (2013.01)

(58) Field of Classification Search
CPC .............. G02F 1/0136; G02F 2203/50; G02F 2203/05; G01B 11/0641; G01B 2210/56; H01S 5/3402
See application file for complete search history.

(56) References Cited

U.S. PATENT DOCUMENTS

| | | | |
|---|---|---|---|
| 4,461,718 | A | 7/1984 | Kaye et al. |
| 4,647,207 | A * | 3/1987 | Bjork .................. G01N 21/211 |
| | | | 356/369 |
| 5,042,951 | A | 8/1991 | Gold et al. |
| 5,220,403 | A | 6/1993 | Batchelder et al. |
| 5,589,689 | A | 12/1996 | Koskinen |
| 5,652,673 | A | 7/1997 | Oakberg |

(Continued)

OTHER PUBLICATIONS

Funke, S. "Imaging Spectroscopic Ellipsometry of MoS2," J. Phys.: Condens. Matter 28 (2016) 385301.

(Continued)

*Primary Examiner* — Marcus H Taningco
(74) *Attorney, Agent, or Firm* — Paradice and Li LLP

(57) ABSTRACT

An optical metrology device produces beams of light with varying wavelengths in a spectral range for measurement of a sample that is at least partially transparent to the spectral range. The light is obliquely incident on the sample, where a portion of the light is reflected off the top surface and a portion is transmitted through the sample and is reflected off the bottom surface. The incident light and/or reflected light is polarized and a phase modulator, such as a photoelastic modulator or electrooptic modulator, is adjusted based on the wavelengths in each beam of light to produce a same retardation of polarization for each beam of light. The reflected light that is received by a detector does not include light reflected from the bottom surface of the sample. A characteristic of a buried structure below the top surface of the sample is determined using the detected reflected light.

45 Claims, 9 Drawing Sheets

(56) References Cited

U.S. PATENT DOCUMENTS

| | | | |
|---|---|---|---|
| 5,939,709 A * | 8/1999 | Ghislain | B82Y 20/00 |
| | | | 250/216 |
| 6,480,277 B1 | 11/2002 | Nafie | |
| 6,587,214 B1 | 7/2003 | Munks | |
| 6,590,710 B2 | 7/2003 | Hara et al. | |
| 7,092,589 B2 | 8/2006 | Kish, Jr. et al. | |
| 7,283,694 B2 | 10/2007 | Welch et al. | |
| 7,349,103 B1 | 3/2008 | Balooch et al. | |
| 7,505,133 B1 * | 3/2009 | Zawaideh | G01B 11/0641 |
| | | | 356/369 |
| 7,554,668 B2 | 6/2009 | Zhou et al. | |
| 7,573,919 B2 | 8/2009 | Cattelan et al. | |
| 7,671,989 B2 | 3/2010 | Liphardt et al. | |
| 7,903,704 B2 | 3/2011 | Patel et al. | |
| 7,928,390 B1 * | 4/2011 | Zhuang | G01J 3/108 |
| | | | 250/339.08 |
| 9,404,872 B1 | 8/2016 | Wang et al. | |
| 9,664,563 B2 | 5/2017 | Lucey | |
| 2002/0016533 A1 * | 2/2002 | Marchitto | A61B 5/0071 |
| | | | 600/310 |
| 2002/0093660 A1 | 7/2002 | Maeda | |
| 2002/0094148 A1 | 7/2002 | McDaniel et al. | |
| 2003/0072336 A1 | 4/2003 | Senapati et al. | |
| 2003/0142904 A1 | 7/2003 | Su | |
| 2009/0174883 A1 * | 7/2009 | Zawaideh | G01B 11/0641 |
| | | | 356/369 |
| 2011/0135301 A1 | 6/2011 | Myslinski et al. | |
| 2012/0224183 A1 * | 9/2012 | Fay | G01B 11/2441 |
| | | | 356/491 |
| 2013/0010311 A1 * | 1/2013 | Kwak | G01N 21/55 |
| | | | 356/630 |
| 2013/0026368 A1 * | 1/2013 | Herzinger | G01N 21/211 |
| | | | 250/341.3 |
| 2014/0375981 A1 * | 12/2014 | Wang | G01N 21/956 |
| | | | 356/51 |
| 2015/0226681 A1 * | 8/2015 | Lei | G01N 21/8806 |
| | | | 356/51 |
| 2016/0146722 A1 * | 5/2016 | Koerner | G01B 9/02091 |
| | | | 356/301 |
| 2019/0354026 A1 * | 11/2019 | Witte | G03F 9/7088 |

OTHER PUBLICATIONS

Nelson, David D. "New Method for Isotopic Ratio Measurements of Atmospheric Carbon Dioxide Using a 4.3um Pulsed Quantum Cascade Laser," Aerodyne Research, Inc.

U.S. Appl. No. 16/352,724, filed Mar. 13, 2019.

* cited by examiner

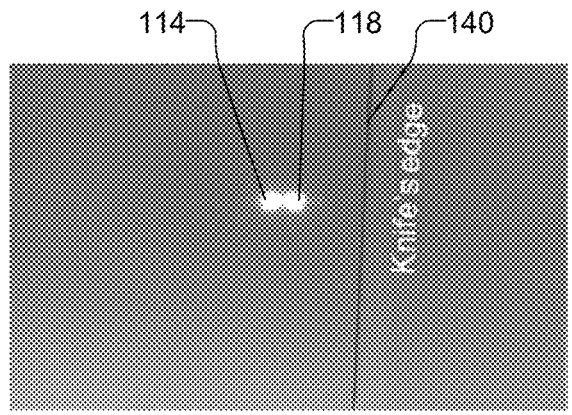 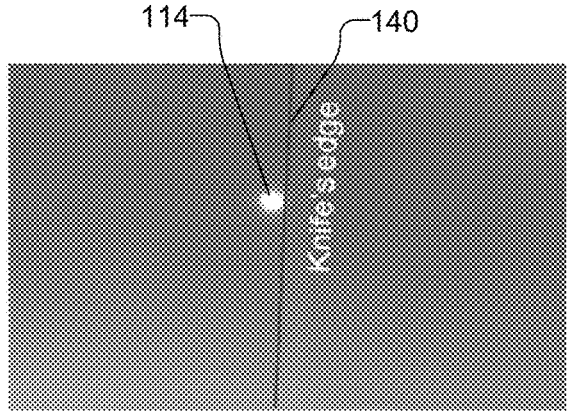
Fig. 3A                Fig. 3B
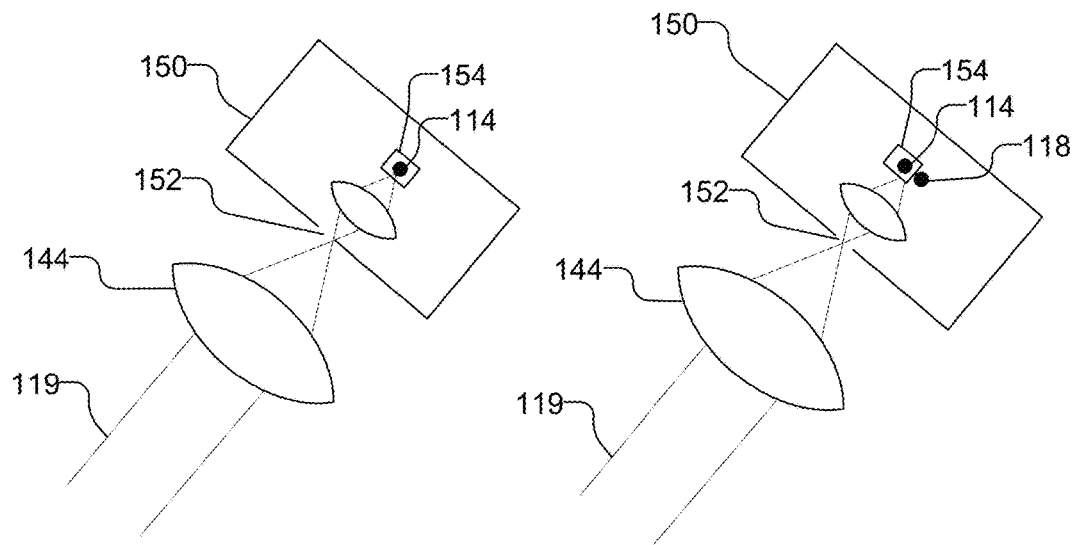
Fig. 4A                Fig. 4B

OPTICAL METROLOGY SYSTEM USING INFRARED WAVELENGTHS

CROSS REFERENCE TO RELATED APPLICATIONS

This application claims priority under 35 USC 119 to U.S. Provisional Application No. 62/642,889, entitled "A MID-INFRARED POLARIZATION MODULATION METROLOGY SYSTEM," filed Mar. 14, 2018, and U.S. Provisional Application No. 62/738,716, entitled "OPTICAL METROLOGY SYSTEM WITH BACK SIDE REFLECTION EXCLUSION," filed Sep. 28, 2018, both of which are incorporated herein by reference in their entireties.

FIELD OF THE INVENTION

The present invention is related to optical metrology and, in particular, to optical metrology of samples that uses multiple wavelengths of light in the infrared spectral range.

BACKGROUND

Semiconductor and other similar industries, often use optical metrology equipment to provide non-contact evaluation of substrates during processing. With optical metrology, a sample under test is illuminated with light, e.g., at a single wavelength or multiple wavelengths. After interacting with the sample, the resulting light is detected and analyzed to determine a desired characteristic of the sample.

One type of sample that is particularly difficult to measure optically is a device with many stacked layers or one or more thick layers. For example, 3D memory technologies, such as vertical NAND flash, rely on the stacking of multiple layers of memory cells. The number of layers scales directly with the amount of memory. Accordingly, manufacturers are increasing the number of layers in order to increase memory. The increase in layers occurs while the channel size remains roughly the same leading to an increasing aspect ratio of these devices. By way of example, with 64 layers in a device structure, current metrology systems struggle to obtain dimensional information from the top to the bottom of the structures at various points in the process flow. As devices scale above 64 layers to, e.g., 96 layers or more, the metrology problem will intensify and some operations may not be possible using conventional optical measurement, such as the measurement of buried structures, e.g., the Tungsten replacement measurement at the bottom of the structure. The underlying physical problem with device structures having many layers or high aspect ratios is that photons are not reaching the buried structures, e.g., elements at the bottom of the structure and/or returning to the detector.

SUMMARY

An optical metrology device produces beams of light with varying wavelengths in a spectral range for measurement of a sample that is at least partially transparent to the spectral range. The light is obliquely incident on the sample, where a portion of the light is reflected off the top surface and a portion is transmitted through the sample and is reflected off the bottom surface. The incident light and/or reflected light is polarized and a phase modulator, such as a photoelastic modulator or electrooptic modulator, is adjusted based on the wavelengths in each beam of light to produce a same retardation of polarization for each beam of light. The reflected light that is received by a detector does not include light reflected from the bottom surface of the sample. A characteristic of a buried structure below the top surface of the sample is determined using the detected reflected light.

In one implementation, an optical metrology device for measuring at least one characteristic of a sample, includes a tunable Quantum Cascade Laser (QCL) light source that produces incident light along an optical path as a plurality of sequential produced beams of light each having different wavelengths in an infrared spectral range between 2.5 µm and 30 µm during measurement of the sample, wherein the sample is at least partially transparent to light in the infrared spectral range; a first set of reflective focusing optics that focuses the incident light to be obliquely incident on a top surface of the sample at an angle of incidence between 40° and 50° and into a measurement spot that is less than 100 µm in diameter, wherein at least a portion of light is reflected from the sample as reflected light; a second set of reflective focusing optics that receives the reflected light from the sample; at least one polarizing element that polarizes at least one of the incident light or the reflected light; at least one phase modulator comprising at least one photoelastic modulator or at least one electrooptic modulator through which the incident light or the reflected light passes, the at least one phase modulator is adjustable based on wavelengths in each beam of light to produce a same retardation of polarization for each sequentially produced beam of light from the tunable QCL light source; a detector that receives the reflected light with the same retardation of polarization for each sequentially produced beam of light and produces signals in response to the reflected light; and at least one processor coupled to receive the signals from the detector, the at least one processor configured to determine at least a characteristic of a buried structure below the top surface of the sample using the signals.

In one implementation, a method for measuring a sample with an optical metrology device, includes producing light with a tunable Quantum Cascade Laser (QCL) light source that produces incident light along an optical path as a plurality of sequential produced beams of light each having different wavelengths in an infrared spectral range between 2.5 µm and 30 µm during measurement of the sample, wherein the sample is at least partially transparent to light in the infrared spectral range; focusing the incident light to be obliquely incident on a top surface of the sample at an angle of incidence between 40° and 50° and into a measurement spot that is less than 100 µm in diameter, wherein at least a portion of light is reflected from the sample as reflected light; polarizing at least one of the incident light or the reflected light; adjusting at least one phase modulator comprising at least one photoelastic modulator or at least one electrooptic modulator through which the incident light or the reflected light passes, wherein adjusting the at least one phase modulator is based on wavelengths in each beam of light to produce a same retardation of polarization for each sequentially produced beam of light from the tunable QCL light source; detecting the reflected light with the same retardation of polarization for each sequentially produced beam of light with a detector that produces signals in response to the detected reflected light; and determining at least a characteristic of a buried structure below the top surface of the sample using the signals.

In one implementation, an optical metrology device for measuring at least one characteristic of a sample, includes a light source that produces incident light along an optical path, wherein the light source is tunable to produce beams of light each having different wavelengths in an infrared spectral range between 2.5 µm and 30 µm during measurement of the sample, wherein the sample is at least partially transparent to light in the infrared spectral range; a first set of reflective focusing optics that obliquely focuses the incident light into a measurement spot on a top surface of the sample at an angle of incidence between 40° and 50°, wherein a first portion of the incident light is reflected off the top surface of the sample, a second portion of the incident light is transmitted through the sample and is reflected off a buried structure below the top surface of the sample, and a third portion of the incident light is transmitted through the sample and is reflected off a bottom surface of the sample, wherein reflected light from the sample comprises light reflected from the top surface, light reflected from the buried structure below the top surface, and light reflected off the bottom surface that is displaced with respect to the light reflected from the top surface and the light reflected from the buried structure below the top surface; a second set of reflective focusing optics in the optical path that receives the reflected light from the sample; at least one polarizing element in the optical path and that polarizes at least one of the incident light or the reflected light; at least one phase modulator in the optical path and through which the incident light or the reflected light passes, the at least one phase modulator is adjustable based on wavelengths in each beam of light to produce a same retardation of polarization for each beam of light produced by the light source; a detector that receives a portion of the reflected light, wherein the first set of reflective focusing optics is configured to produce the angle of incidence and a size of the measurement spot so that the portion of the reflected light detected by the detector comprises the light reflected from the top surface and the light reflected from the buried structure below the top surface and does not include the light reflected off the bottom surface, the detector produces signals in response to the portion of the reflected light detected by the detector; and at least one processor coupled to receive the signals from the detector, the at least one processor configured to determine at least a characteristic of the buried structure below the top surface of the sample using the signals.

In one implementation, a method for measuring a sample with an optical metrology device, includes producing incident light along an optical path as beams of light each having different wavelengths in an infrared spectral range between 2.5 µm and 30 µm during measurement of the sample, wherein the sample is at least partially transparent to light in the infrared spectral range; focusing the incident light with a first set of reflective focusing optics in the optical path, the incident light is focused into a measurement spot on a top surface of the sample at an angle of incidence between 40° and 50°, wherein a first portion of the incident light is reflected off the top surface of the sample, a second portion of the incident light is transmitted through the sample and is reflected off a buried structure below the top surface of the sample, and a third portion of the incident light is transmitted through the sample and is reflected off a bottom surface of the sample, wherein reflected light from the sample comprises light reflected from the top surface, light reflected from the buried structure below the top surface, and light reflected off the bottom surface that is displaced with respect to the light reflected from the top surface and the light reflected from the buried structure below the top surface; receiving the reflected light from the sample with a second set of reflective focusing optics in the optical path; polarizing at least one of the incident light or the reflected light; adjusting at least one phase modulator through which the light or the reflected light passes based on each wavelength of light in each beam of light to produce a same retardation of polarization for each beam of light; detecting a portion of the reflected light with a detector, wherein the first set of reflective focusing optics is configured to produce the angle of incidence and a size of the measurement spot so that the portion of the reflected light detected by the detector comprises the light reflected from the top surface and the light reflected from the buried structure below the top surface and does not include the light reflected off the bottom surface, the detector producing signals in response to the portion of the reflected light detected by the detector; and determining at least a characteristic of the buried structure below the top surface of the sample using the signals.

BRIEF DESCRIPTION OF THE DRAWINGS

FIG. 3A illustrate a retracted knife edge allowing both front side reflected light and back side reflected light to pass;

FIG. 3B illustrate a knife edge block the back side reflected light and allowing only the front side reflected light to pass.

FIG. 4A illustrates the detector physically excluding the detection of the back side reflection using the edge of an entrance pupil as a knife edge.

FIG. 4B illustrates the detector physically excluding the detection of the back side reflection by being positioned to so that the back side reflection is not incident on the photodetector element.

DETAILED DESCRIPTION

Figure 1:
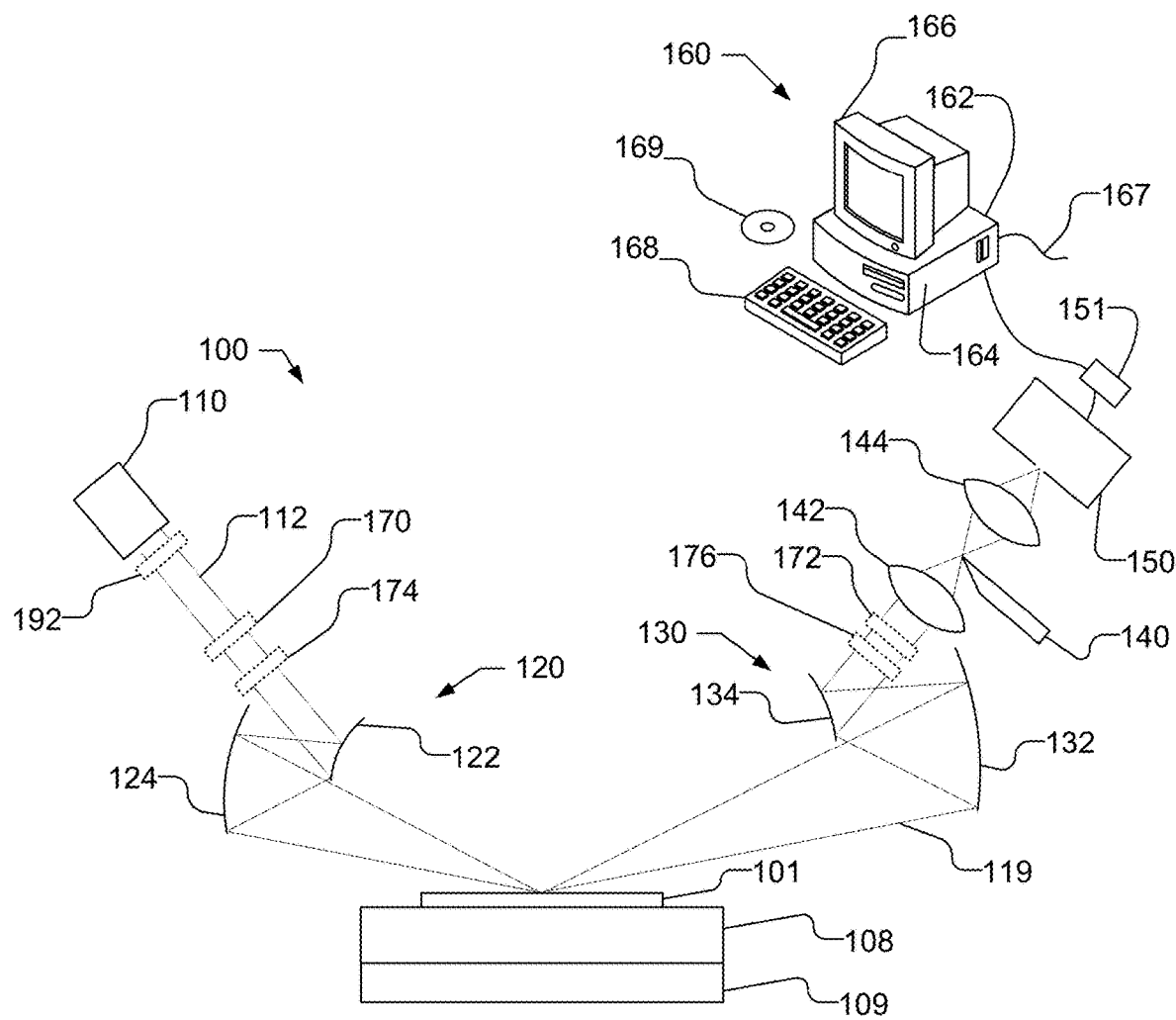
FIG. 1 illustrates a schematic view of an optical metrology device configured to perform measurements of a sample that is at least partially transparent to the spectral range of light used by the optical metrology device.

FIG. 1 illustrates a simplified schematic view of an optical metrology device 100 that is capable of determining characteristics of a sample 101 and in particular buried structures, e.g., underlying layers or features that are deep within the sample and which cannot be measured using conventional optical metrology techniques. The optical metrology device 100 may be configured to perform, e.g., reflectometric or ellipsometric including Mueller Matrix ellipsometric, measurements of the sample 101 using a spectral range of light to which the sample 101 is at least partially transparent. Thus, the light from the optical metrology device 100 penetrates the sample 101 to reach buried structures and is returned to the detector so that the buried structures may be characterized.

By way of example, while silicon is transparent in the mid-infrared spectral region, the optical metrology device 100 may be configured to measure a silicon sample using light with wavelengths in an infrared or mid-infrared spectral region. The optical assembly of the optical metrology device 100, including the light source, is configured to operate in the spectral region that is at least partially transparent to the sample 101 while producing useful signals from the sample 101. For example, the presence of back side reflections may swamp signals from buried structures in the return signal. Accordingly, the optical assembly is configured so that signals from buried structures are received, while back side reflections caused by the incident light passing through the sample 101 and reflecting off the bottom surface of the sample 101 or the chuck 108 supporting the sample 101 are eliminated. In another example, components within the optical assembly, such as a tunable light source and one or more phase modulator, e.g., photoelastic modulators (PEM) or electrooptic modulators, are configured to provide useful signals in the mid-infrared spectral region.

Optical metrology device 100 includes a light source 110 that produces light 112, e.g., in the mid-infrared spectral region. For example, light source 110 may produce infrared light having wavelengths between 2.5 µm and 30 µm, or more particularly between 5 µm and 13 µm, or other desired ranges. The light 112 produced by light source 110 may include a range of wavelengths, i.e., broadband, or may be monochromatic. The light source 110 may be tunable to sequentially produce light with different wavelengths in a desired spectral range. By way of example, the light source 110 may be a coherent, broadly tunable laser based emitter that provides a suitable average power, e.g., greater than 1 mW at the sample, and more particularly 10-100 mW, for signal to noise (SNR) considerations. It may be desirable, however, to avoid average powers greater than 100 mW because of: (1) damage to the sample, (2) photothermal effect. For example, well before a sample may be damaged, it may be possible to generate thermal waves in nominally transparent dielectrics through exposure of mid-infrared wavelengths at which there is substantial absorption, e.g., ~10 µm for $SiO_2$, which may complicate the interpretation of the measured results. For example, light source 110 may be a tunable Quantum Cascade Laser (QCL), which produces infrared light in the desired wavelengths. In one implementation, the QCL light source 110 may be the type purchased from Block Engineering, LLC, DRS Daylight Solutions, or Pranalytica. In another implementation, the light source 110 may be, e.g., optical parametric oscillator (OPO) or amplifiers (OPA), or a frequency comb laser source paired with a monochromator. The repetition rate of a laser based light source should be greater than 1 MHz or a continuous wave methodology may be used. Lower repetition rates may be used, e.g., less than 500 kHz, however, the timing of the modulated must be synchronized with the light source using a triggering system.

The optical metrology device 100 includes focusing optics 120 that focus the light 112 and direct the light to be obliquely incident on a top surface of the sample 101. The focusing optics 120 may be refractive, reflective, or a combination thereof. Focusing optics 120 may be an objective lens, and is illustrated in FIG. 1 as including reflective optical elements 122 and 124, which focus the light 112 and direct the light to be obliquely incident on the sample 101. Reflective optical elements 122 and 124 may have a bare or protected Gold or Aluminum coating on a metal or glass substrate. The reflective optical elements 122 and 124 may include Schwarzschild objective, spherical, elliptical, off-axis parabolic mirrors or combinations thereof. Moreover, additional or fewer reflective optical elements may be used for the focusing optics 120. If desired, refractive optics may be additionally or alternatively used in the focusing optics 120. Refractive optics may be made of a materials including, but not limited to, Zinc Selenide, Silicon, Germanium, Magnesium Fluoride, Barium Fluoride, or Calcium Fluoride.

The reflected light 119 from the sample 101 is received by another set of focusing optics 130. As with focusing optics 120, the focusing optics 130 receiving the reflected light 119 may be refractive, reflective, or a combination thereof. For example, focusing optics 130 may be an object lens that matches the objective lens if used for focusing optics 120. Focusing optics 130 are illustrated as including reflective optical elements 132 and 134 to receive the reflected light 119. The reflective optical elements 132 and 134 may have a bare or protected Gold or Aluminum coating on a metal or glass substrate. The reflective optical elements 132 and 134 may include Schwarzschild objective, spherical, elliptical, off-axis parabolic mirrors or combinations thereof. Moreover, additional or fewer reflective optical elements may be used for the focusing optics 130. If desired, refractive optics may be additionally or alternatively used in the focusing optics 130. Refractive optics may be made of a materials including, but not limited to, Zinc Selenide, Silicon, Germanium, Magnesium Fluoride, Barium Fluoride, or Calcium Fluoride.

A detector 150 receives the reflected light 119. The detector 150 may include one or more single pixel photodetector elements, e.g., a monolithic chip with a single pixel that is sensitive to infrared light. The size of the detector element may be selected to be consistent with the beam size at the plane of the detector element. The detector 150 should be matched to the output range of the light source 110. For example, a charge-coupled device (CCD) type or complementary metal-oxide-semiconductors (CMOS) type detectors are typically manufactured with silicon, and are thus not appropriate for detecting infrared wavelengths. A variety of materials and detector configurations are appropriate for specific ranges within the infrared. For example, a thermoelectrically cooled (TEC) Mercury Cadmium Telluride (MCT) detector may be used with a light source that produces a wavelengths in a mid-infrared spectral region, e.g., approximately 5 µm to 13 µm. A liquid nitrogen cooled MCT detector may be used for low signal levels, or Deuterated-Triglycine Sulfate based elements (DTGS) for applications with high reflection values and potential MCT detector saturation. In embodiments where the wavelength range is approximately 2 µm to 5 µm, Lead Selenide (PbSe), Indium Antimonide (InSb), or Indium Gallium Arsenide (InGaAs) based detectors may be used for enhanced detectivity. The signal output from the detector 150 may be pre-amplified with a transimpedance amplifier 151.

The optical assembly of optical metrology device 100 is configured so that signals, i.e., reflected light, from structures buried within the sample are received, while reflections from the back side of the sample or the chuck 108 under the sample are eliminated.

Figure 2:
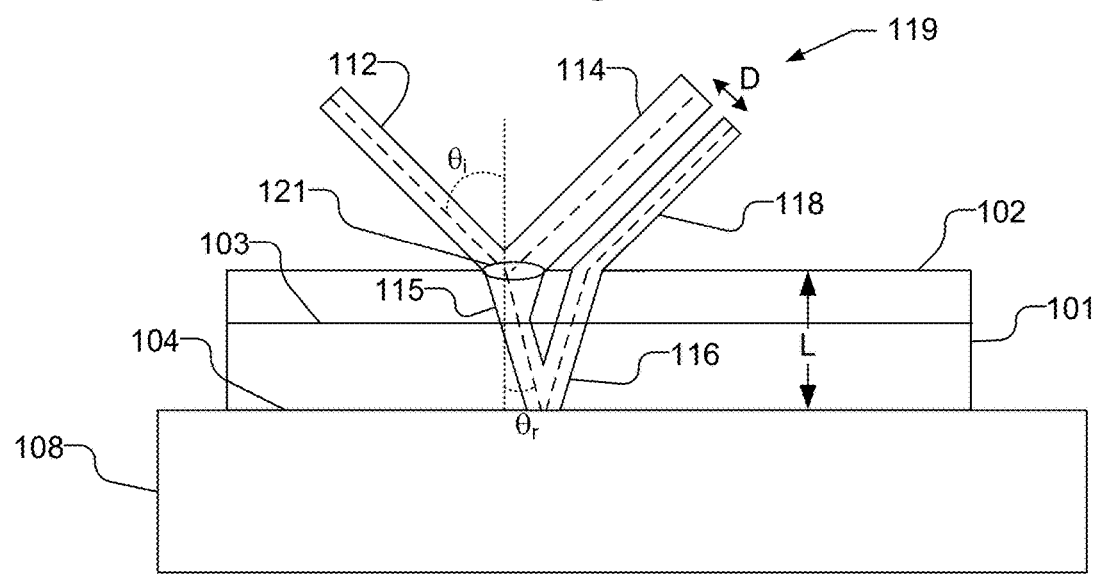
FIG. 2 illustrates a side view of the sample with obliquely incident light and reflected light including front side reflected light and back side reflected light.

FIG. 2, by way of example, is a simplified illustration of a side view of the sample 101 with light 112 obliquely incident on the top surface 102. A portion of the incident light is reflected by the top surface 102. Additionally, the sample 101 is at least partially transparent to the light 112 and, accordingly, a portion 115 of the light is transmitted through the sample 101. As illustrated, a structure 103 under the top surface 102 of the sample 101 may reflect a portion of the light that is transmitted through the sample 101. The structure 103 is considered to be a "buried" structure as it is deep within the sample 101, e.g., underlying the top surface 102 in a way, e.g., by large depth, opaque overlying layers, and/or form factor, that makes measurement of the structure using conventional non-IR optical metrology difficult or impossible. For example, while the buried structure 103 appears in FIG. 2 as a layer, the buried structure may be a feature, such as a bottom of a via, a line, or other such discrete features. The buried structure 103 may sometimes be referred to as an underlying structure as it is below the top surface 102, although there may be no layers physically above the structure 103, e.g., where the structure is the bottom of a via. Moreover, while FIG. 2 illustrates a single buried layer 103 in sample 101 for simplicity, it should be understood that the sample 101 may include many buried structures, e.g., as found in 3D memory technologies, such as vertical NAND flash or other technologies. The portion of the light that is reflected by the top surface 102 and reflected by the buried structure 103 forms the sample reflection 114 that is to be received by the detector 150 of the optical metrology device 100.

With the wavelengths of light to which the sample 101 is at least partially transparent, a significant portion of the light that is transmitted through the sample 101 will arrive at and will be reflected by the back surface 104 of the sample 101. Many samples 101, such as double side polished wafers for 200 mm and 300 mm wafers, will efficiently reflect the light from the back surface 104 of the sample 101. Light that is not reflected by the back surface 104 of the sample 101 will be reflected by the top surface of the chuck 108 that holds the sample 101. Thus, the back side of the sample 101 produces a back side reflection, as illustrated by reflected beam 116. At least a portion of reflected beam 116 is transmitted through the sample 101, and forms back side reflection 118. Thus, as can be seen in FIG. 2, because the sample 101 is at least partially transparent to the incident light, the resulting reflected light 119 from the sample 101 includes both the desired sample reflection 114 from the top surface 102 and buried structure 103 and back side reflections 118 from the bottom surface 104 of the sample 101. The back side reflection 118 is undesirable as it complicates the analysis of the characteristics of the sample 101. For example, the back side reflection 118 may have a significantly greater intensity than reflections from the buried structures 103 to be measured, making it difficult to detect signals from the buried structure 103.

Thus, the optical assembly of optical metrology device 100 is configured to exclude the back side reflection 118 from detection by the detector 150, shown in FIG. 1. In one implementation, to exclude the back side reflection 118 the focusing optics 120 are configured to produce a large displacement D between the back side reflection 118 and the sample reflection 114, as illustrated in FIG. 2. With an adequate displacement D between the between the sample reflection 114 and the back side reflection 118, the back side reflection 118 may be removed or disregarded while still detecting and analyzing the sample reflection 114. The focusing optics 120 may be configured to produce an adequate displacement D between the between the sample reflection 114 and the back side reflection 118 through an appropriate choice of the angle of incidence $\theta_i$ of the incident light 112 and numerical aperture NA to produce an appropriate measurement spot size 121, so that there is little or no overlap between the sample reflection 114 and the back side reflection 118. For example, the displacement D between the centers of the sample reflection 114 and the back side reflection 118, as illustrated schematically in FIG. 2, is determined based on the incidence angle $\theta_i$, the sample thickness L, the refracted angle $\theta_r$ within the sample, and the refractive index n of the sample as follows:

$$D = 2*L*\tan(\theta_r)*\sin\left(\frac{\pi}{2} - \theta_i\right); \quad \text{eq. 1}$$

$$\theta_r = \sin^{-1}\left(\frac{n_i}{n_r}\sin\theta_i\right) \quad \text{eq. 2}$$

By appropriate selection of the incidence angle $\theta_i$ an adequate displacement D between the centers of the sample reflection 114 and the back side reflection 118 may be produced. By way of example, an incidence angle $\theta_i$ between 40° to 50° may be used. Based on equations 1 and 2, it can be seen that the maximum displacement occurs at 45°, and accordingly, an incident angle $\theta_i$ of 45° may be used. In comparison, conventional ellipsometers use an incident angle of 70° and reflectometers typically use an incident angle of 0°. Optical metrology device 100, however, does not use such conventional incident angles, in order to reduce or prevent overlap of the back side reflections 118 with the sample reflection 114.

Additionally, the measurement spot size 121 affects whether the back side reflection 118 will overlap the sample reflection 114. For example, if a very large measurement spot size 121 is used, a large percentage of the back side reflection 118 will overlap the sample reflection 114. By focusing the light 112 into a sufficiently small spot on the sample 101, however, there may be little or no overlap between the sample reflection 114 and the back side reflection 118. By way of example, a diameter of the incident spot of 100 µm or less, e.g., less than 70 µm, may be used. For the case of light with a 10 µm wavelength incident on a 750 µm thick silicon wafer at 45°, a 100 µm diameter beam spot will produce a center to center beam separation of 175 µm. For a given angular geometry and substrate thickness, having reasonable separation at a larger spot size ensures separation as the spot size reduces.

With the sample reflection 114 and back side reflection 118 adequately displaced, the back side reflection 118 may be excluded from detection by the detector 150, e.g., by ensuring the back side reflection 118 is not incident on the photodetector element or photodetector elements of the detector 150. In some implementations, the back side reflection 118 may be physically blocked, e.g., using a knife edge 140, as illustrated in FIG. 1, which blocks the back side reflection 118, while allowing the sample reflection 114 to pass. The knife edge 140 may be located at a point in the optical system of the optical metrology device 100 where the sample reflection 114 and the back side reflection 118 may be isolated from each other. FIG. 1, for example, illustrates a knife edge 140 generally disposed between the sample 101 and the detector 150, e.g., between the receiving focusing optics 130 and a detector 150 or between a polarizer (analyzer) if used and the detector 150. As illustrated, the knife edge 140 is between lenses 142 and 144 and is located at the focal plane of the lens 142, which images the sample reflection 114 and the back side reflection 118. The knife edge 140 blocks the back side reflection 118, i.e., the reflected light from the bottom surface of the sample 101. The lens 144 thus receives the sample reflection 114, but not the back side reflection 118, and provides the sample reflection 114 to the detector 150. Accordingly, the back side reflection 118, which is blocked by the knife edge 140, is not received by the detector 150.

FIGS. 3A and 3B, by way of example, illustrate images at the location of a knife edge 140, e.g., at the focal plane of lens 142, for a 100 µm spot produced by light that is incident on a partially transparent sample at 45°. In FIG. 3A, the knife edge 140 is illustrated as being retracted and thus, both the sample reflection 114 and the back side reflection 118 can be seen. In FIG. 3B, the knife edge 140 is in position and blocks the back side reflection, allowing only the sample reflection 114 to pass.

If desired, the back side reflection 118 may be excluded from being received by the detector 150 in other manners. For example, as illustrated in FIGS. 4A and 4B, the detector 150 itself may be used to physically exclude the detection of the back side reflection 118. For example, as illustrated in FIG. 4A, the entrance pupil 152 of the detector 150 may be located at the focal plane of lens 144, which the sample reflection 114 and the back side reflection 118. The detector 150 may be positioned so that the reflected light 119 passes off-center through the entrance pupil 152 with the back side reflection 118 blocked by the side of the entrance pupil 152, while the sample reflection 114 is permitted to pass through the entrance pupil 152 and received by a single pixel photodetector element 154 of the detector 150. Thus, the wall of the entrance pupil 152 of the detector 150 effectively operates as a knife edge to block the back side reflection 118.

FIG. 4B illustrates another way in which the back side reflection 118 in the reflected light 119 may be excluded from being received by the detector 150. As illustrated in FIG. 4B, both the sample reflection 114 and the back side reflection 118 pass through the entrance pupil 152 of the detector, but the detector 150 may be positioned so that only a portion of the reflected light 119, i.e., the sample reflection 114, is received by the photodetector element 154, while the back side reflection 118 falls of the photodetector element 154. If multiple photodetector elements are used, e.g., in an array, the signals form photodetectors elements that receive the back side reflection 118 may be excluded from the sample analysis.

It should be understood that there may be additional optical elements in the beam path of the optical metrology device 100. For example, the optical system may include additional optical elements in the beam path after the light source 110 to expand the light 112 to allow the focusing optics 120 to achieve a desired optical spot size on the sample 101. Moreover, the optical system may include additional optical elements in the beam path before the detector 150, such as a beam expansion or reduction system, to alter the size of the beam, e.g., to make it commensurate with the detector element size. The beam expansion or reduction systems may include one or more refractive optics that may be manufactured from, e.g., bare or protected Gold or Aluminum coating on a metal or glass substrate and/or reflective optics, that may be manufactured from, e.g., Zinc Selenide, Silicon, Germanium, Magnesium Fluoride, Barium Fluoride, or Calcium Fluoride.

Additionally, one or more polarizing elements may be in the beam path of the optical metrology device 100. For example, as illustrated with dotted lines in FIG. 1, optical metrology device 100 may include one or both (or none) of a polarizing element 170 in the beam path before the sample 101, and a polarizing element (analyzer) 172 in the beam path after the sample 101. For example, Zinc Selenide wire grid polarizers may be used to control the input polarization state as well as the final state of the beam before it excites the detecting element in detector 150. If the optical metrology device 100 uses a polarizing element, e.g., as part of an ellipsometric measurement system, accurate operation is dependent on the polarization controlling component. For example, a high extinction ratio, e.g., greater than 1000 to 1, and transmission efficiency of the polarization controlling components is desirable for measurement accuracy and signal to noise ratio (SNR).

In addition, the optical metrology device 100 may include one or more phase modulators, such as photoelastic modulators (PEMs), electrooptic modulators, or rotating compensators, in the beam path. For example, FIG. 1 illustrates, with dotted lines, a PEM 174 in the beam path before the sample 101, and a PEM 176 in the beam path after the sample 101, which none, either or both may be present in the optical metrology device 100. The function of the PEM 174, for example, is to generate a time dependent polarization to the light beam at the detector 150, either before or after reflecting off the sample 101, or both before and after reflecting off the sample 101, depending on the geometry. The time dependent nature is such that the beam oscillates between linearly polarized and circularly polarized states with a known frequency, e.g., on the order of 50 kHz. Where one or more PEMs 174 and 176 are used, the time response of the detector 150 should be sufficient to respond to the modulation rate of the PEMs. The transimpedance amplifier 151 that pre-amplifies the signal output from the detector 150 may have a bandwidth that is at least twice the modulation frequency of the PEM, e.g., and may be 200 kHz or greater. It should be understood that while PEMs 174 and 176 are illustrated, the phase modulators may be electrooptic modulators or other appropriate types of modulators.

The one or more PEMS 174, 176 may be adjusted such that each wavelength of light that is sequentially produced by the tunable light source 110 has the same retardation of polarization at each wavelength. For example, the voltage applied to the PEMs 174 and/or 176 may be set to a specific value for each different wavelength produced by the light source 110 to achieve the same retardation. Thus, with a wavelength variable light source 110, such as a tunable QCL, the desired retardation and wavelength are inputs used to set the voltage applied to the transducers in the body of the PEM. The general scheme, therefore, requires that the wavelength of the light source 110, e.g., the tunable QCL, be tuned and the voltage on the PEM 174 and/or 176 be adjusted simultaneously to create the same retardation, such as quarter wavelength, across the spectral range of the light source 110, i.e., sequential not parallel operation. The sequential operation of the system may be dictated by the tunable nature of the light source 110. The desired retardation and wavelength are inputs used to set the voltage applied to the transducers in the body of the PEM. The calibration of the voltage applied to the transducers in the body of the PEM may be performed by measuring transmission through the entire optical system with specific polarizer and modulator orientations. If two PEMs 174 and 176 are used, the modulation frequencies may differ by a few kHz or more. The body of the PEMs used in the optical metrology device 100 may be, e.g., Zinc Selenide.

If desired, a rotating compensator may be used for retardation instead of a PEM. A rotating compensator operates at a much lower frequency compared to PEMs (<1 kHz vs 50 kHz) and therefore may reduce throughput compared to use of PEMs. However, multiple wavelengths may be simultaneously retarded with a rotating compensator. Use of a rotating compensator could be used to multiplex the system provided the use of multiple light sources and detectors or an array detector.

Figure 5:
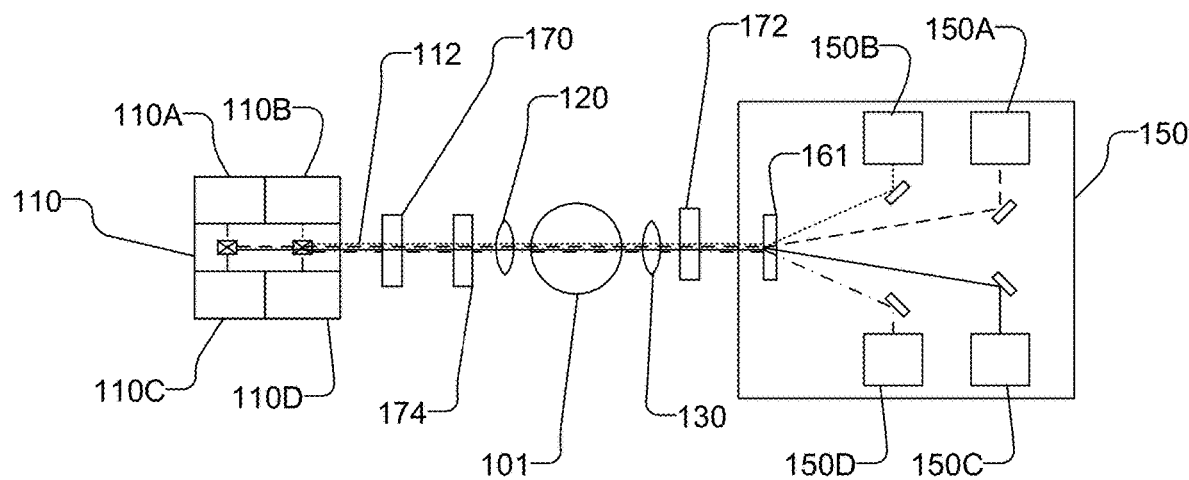
FIG. 5 illustrates an operational mode of an optical metrology device in which multiple discrete wavelengths are simultaneously produced by the light source and separately received by the detector.

For example, FIG. 5 illustrates a top view of an ellipsometery configuration of the optical metrology device 100, including light source 110, a polarizing element 170, a phase modulator 174, focusing optics 120, sample 101, receiving focusing optics 130, an analyzer (polarizing element) 172, and a detector 150. As illustrated, the light source 110 may include multiple combined sub-light sources 110A, 110B, 110C, and 110D, which may produce light with differing ranges of wavelengths, which are combined, e.g., using beam splitters, into a single light beam 112 (the beams from each light source 110A, 110B, 110C, and 110D are illustrated separately in light beam 112 for the sake of clarity). By way of example, the light source 110 may be a tunable QCL light source and may include four separate tunable lasers 110A, 110B, 110C, and 110D, each producing light that is generated along the same beam path. If desired, other tunable monochromatic light sources (including broad band light sources with a monochromator) may be used. Each light source 110A, 110B, 110C, and 110D may be individually tuned to simultaneously produce a single wavelength (or small range of wavelengths) that differs from the wavelengths produced by the other light sources. Thus, light source 110 may produce a light beam 112 having a plurality of different known wavelengths (e.g., four in the present example). The phase modulator 174 may simultaneously retard the light from each of the light sources 110A, 110B, 110C, and 110D. To obtain the same retardation simultaneously at all wavelengths, a rotating compensator, as opposed to a single photoelastic or electrooptic modulator, may be used. If desired, however, a photoelastic or electrooptic modulator may be used if the variable retardation induced at multiple wavelengths at a given voltage is taken into account. This process is a straightforward application of the voltage to retardation to wavelength calibration mapping inherent in fixed retardation scanned wavelength topologies. The detector 150, as illustrated, may include a beam separator 161, e.g., a diffraction grating, so that the light produced by each separate light source 110A, 110B, 110C, and 110D may be separated and detected by separate photodetector elements. In the example illustrated in FIG. 5, detector 150 may include a number of photodetector elements 150A, 150B, 150C, and 150D, corresponding to the number of light source 110A, 110B, 110C, and 110D, wherein each photodetector elements receives a beam separated by the beam separator 161, e.g., using appropriate optics illustrated in FIG. 5 as mirrors. If desired, the detector 150 may include an array of photodetector elements that receives each beam separated by the beam separator 161 along a different row (and/or column). Accordingly, multiple n (where n=4 in FIG. 5) beams, each having varying discrete wavelengths, may be processed simultaneously to improve throughput.

It should be understood that the optical assembly in the optical metrology device may have a variety of configurations and operational modes and is not limited to that shown in FIG. 1 or 5. For example, FIGS. 6A-6E schematically illustrate various configurations and operational modes that may be possible and that may optionally use a knife edge 140 present between the sample 101 and the detector 150, e.g., between receiving focusing optics 130 and the detector 150. As illustrated by dotted lines, the knife edge 140 may be alternatively located between the sample 101 and the receiving focusing optics 130. As discussed above, a separate knife edge 140 may not be necessary to eliminate the back side reflection 118 from being detected, e.g., with the use of the entrance of the detector 150 serving as a blocking element or the photodetector element of the detector positioned to receive only the sample reflection 114 and not the back side reflection 118. It should be understood that the configurations illustrated in FIGS. 6A-6E are simplified as there may be additional optical components, including one or more lenses to produce an image of the sample reflection and the back side reflection at the location of the knife edge 140. Moreover, while focusing optics 120 and 130 are illustrated in FIGS. 6A-6E as refractive lenses, reflective lenses may be used.

Figure 6A:
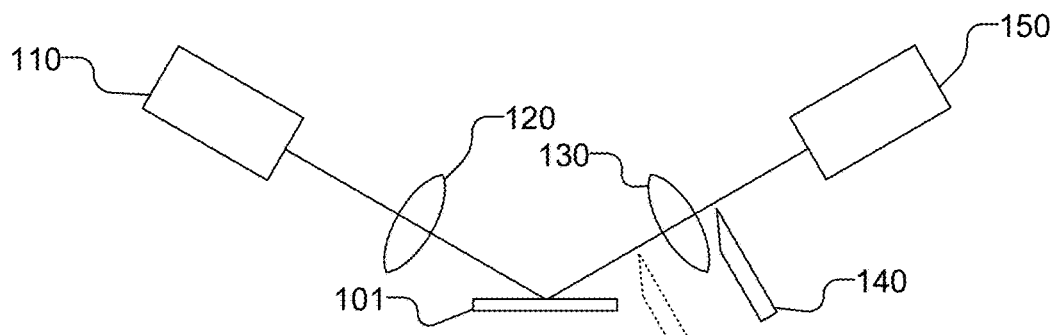
FIGS. 6A-6E schematically illustrate various configurations and operational modes of an optical metrology device.
Figure 6B:
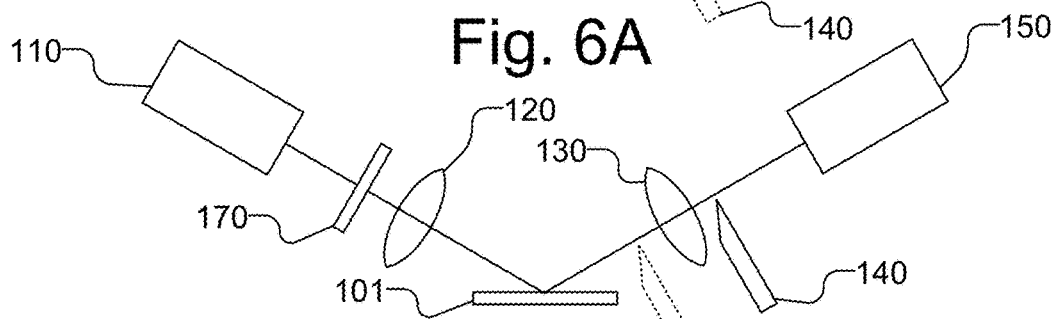

FIG. 6A, for example, illustrates a reflectometry configuration including a light source 110, focusing optics 120, sample 101, receiving focusing optics 130, and detector 150. FIG. 6B similarly illustrates a reflectometry configuration including a light source 110, focusing optics 120, sample 101, receiving focusing optics 130, and detector 150, with a polarizing element 170 located between the light source 110 and the sample 101, e.g., before the focusing optics 120.

Figure 6C:
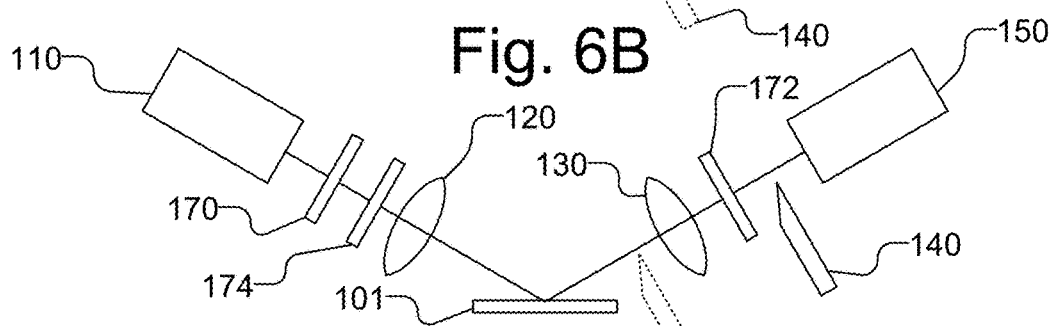
Figure 6D:
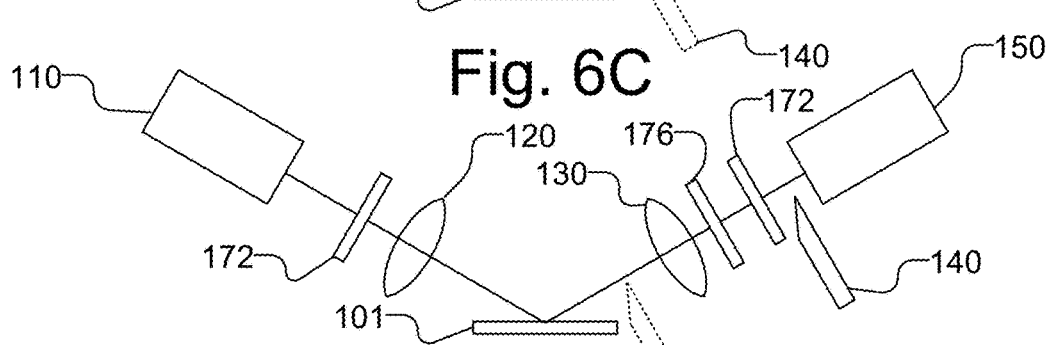
Figure 6E:
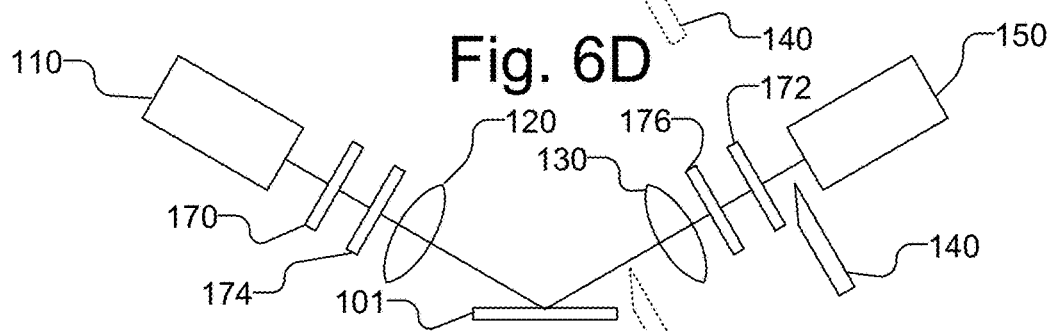

FIG. 6C illustrates an ellipsometery configuration including a light source 110, a polarizing element 170, a PEM 174 (or compensator), focusing optics 120, sample 101, receiving focusing optics 130, an analyzer (polarizing element) 172, and detector 150. FIG. 6D illustrates another ellipsometery configuration similar to the configuration of FIG. 6C, but with PEM 174 (or electrooptic modulator or rotating compensator) replaced with PEM 176 (or electrooptic modulator or rotating compensator) between receiving focusing optics 130 and the analyzer 172. FIG. 6E illustrates a Mueller Matrix ellipsometer configuration including a light source 110, a polarizing element 170, a PEM 174 (or electrooptic modulator or rotating compensator), focusing optics 120, sample 101, receiving focusing optics 130, a second PEM 176 (or electrooptic modulator or rotating compensator), an analyzer (polarizing element) 172, and detector 150.

The operation and analysis of the reflectometers of FIGS. 6A and 6B, ellipsometers of FIGS. 6C and 6D and the Mueller Matrix ellipsometer of FIG. 6E will be well understood to those of ordinary skill in the art in light of the present disclosure. For example, the voltage output from the detector 150 may be monitored to extract the DC as well as the 1st and 2nd harmonic at the PEM modulation frequency in the case of a single modulator, as illustrated in FIGS. 6C and 6D. The DC signal may be extracted by including an optical chopper 192 after the light source 110 or directly monitoring the DC voltage of the detector. If two modulators are used as illustrated in FIG. 6E, they may have different resonant frequencies and the voltage may be monitored at DC, 1st and 2nd harmonic, the sum and difference frequencies of the two modulators, as well as the twice the sum and difference frequencies. With a single PEM, as illustrated in FIGS. 6C and 6D, the conventional ellipsometric values of N, C and S may be extracted, as will be understood by those of ordinary skill in the art. Further, through incorporation of a second PEM in the optical path after the beam has reflected off the sample and preceding the analyzing linear polarizer, as illustrated in FIG. 6E, eight components of the Mueller Matrix may be simultaneously measured, as will be understood by those of ordinary skill in the art. By further extension, the use of four PEMs would allow simultaneous measurement of all components of the Mueller Matrix.

Figure 7:
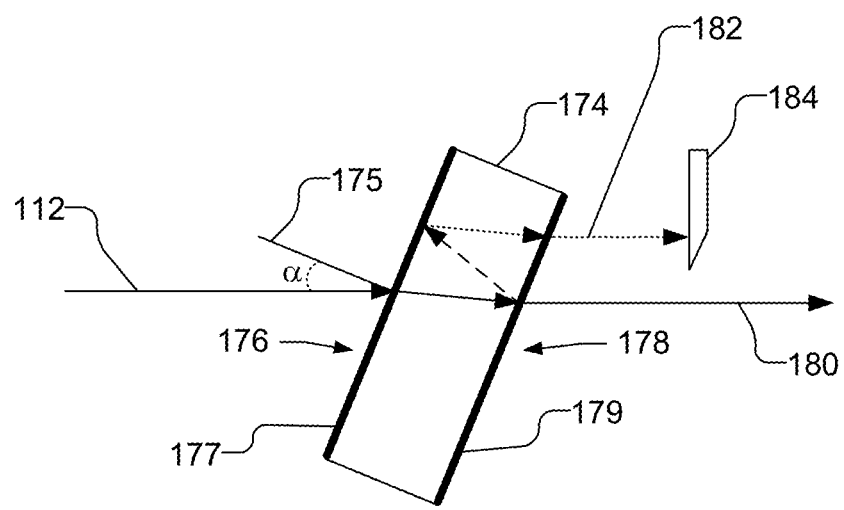
FIG. 7 illustrates elimination of back side reflection in a phase modulator used in the optical metrology device.

FIG. 7 illustrates a view of a phase modulator used in the optical metrology device 100 of FIG. 1, in which back side reflections from the phase modulator are eliminated. The phase modulator is a macroscopic piece of refractive material. Anti-reflective coatings 177 and/or 179 may be used with the phase modulator to help reduce internal reflections. Anti-reflective coatings, however, are not perfect, i.e., they are not capable of eliminating all reflections, particularly over a range of wavelengths as wide as 5 um to 13 um. Accordingly, there will be a multiplicity of internally reflected beams. This is addressed by positioning the phase modulator at an angle with respect to the optical beam. As shown, the phase modulator, illustrated as PEM 174 in FIG. 7, may be positioned with respect to the optical path of the light 112 so that there is a non-zero angle α between surface normal 175 of an entrance surface 176 of the PEM 174 and the optical path of the light 112. The light 112 is emitted from an exit surface 178 of the PEM 174 as a primary beam 180, as illustrated in FIG. 7. Internal reflection within the PEM 174, however, results in a secondary beam 182 being emitted from the exit surface 178 of the PEM 174. Due to the tilting of the PEM 174 to produce non-zero angle α between surface normal 175 of an entrance surface 176 of the PEM 174 and the optical path of the light 112, the secondary beam 182 is displaced from the primary beam 180. The PEM 174, for example, may be positioned at an angle α of, e.g., between 5° and 30°, but too large of an angle α, e.g., larger than 30° may impact the operation of the PEM 174. In one implementation, to reduce the internal reflection of the light, the phase modulator, e.g., PEM 174, may include an anti-reflective coating 177 on the entrance surface 176, and an anti-reflective coating 179 on the exit surface 178 of the PEM 174, but if desired, only one surface, e.g., exit surface 178, may include the anti-reflective coating. The use of anti-reflective coating substantially reduces the intensity of light in the secondary beam 182, but may not eliminate all internal reflections. In one implementation, a knife edge 184 may be positioned with respect to the exit surface 178 to block the secondary beam 182, so that only the primary beam 180 propagates through the optical assembly of the optical metrology device 100. It should be understood that either or both of the knife edge and anti-reflective coating(s) may be used with the phase modulator. Moreover, it should be understood that while PEM 174 is illustrated in FIG. 7, PEM 176 may be similarly configured.

Figure 8:
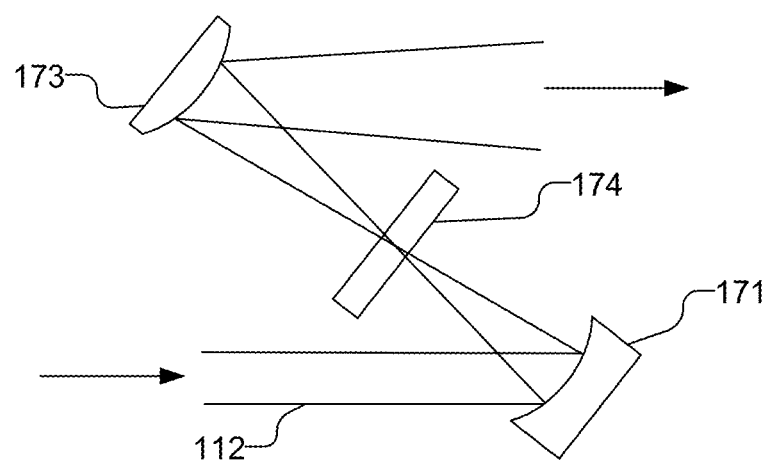
FIG. 8 illustrates a portion of the optical assembly of the optical metrology device including a phase modulator and optical elements to focus the light through the phase modulator.

FIG. 8 illustrates a portion of the optical assembly of the optical metrology device 100 of FIG. 1 including a phase modulator, which is illustrated as PEM 174, but may be PEM 176. As discussed above, the PEM 174 may include anti-reflective coatings, may be positioned at a non-zero angle α with respect to the optical beam, and may include a knife edge to block a secondary beam. By focusing the beam through the PEM 174, the multiplicity of reflections may be blocked by the knife edge 184, shown in FIG. 7, as the spot size at each reflection is smaller relative to the displacement achieved at a given angle α. Thus, as can be seen in FIG. 8, light 112 from the light source 110 may be focused through the PEM 174 in order to reduce the spot size of each internal reflection. As illustrated, a first reflective optical element 171 receives the incident light 112 and focuses the light through the PEM 174. Moreover, the first reflective optical element 171 is useful in expanding the illumination to fill an entrance pupil of an objective lens located after the PEM 174. As illustrated, a second reflective optical element 173 receives the light 112 and directs the light after passing through the PEM 174. The second reflective optical element 173 is illustrated as convex, which may be useful to further expand the illumination to fill the entrance pupil of an objective lens located after the PEM 174. The second reflective optical element 173, however, may be concave, flat, or in some implementations removed for the optical path. It should be understood that for PEM 176, e.g., a PEM located in the optical path after the sample 101, the first reflective optical element receives the reflected light 119 and focuses the reflected light 119 through the PEM 176, which is received and collimated by the second reflective optical element. Moreover, it should be understood that refractive optical elements may be used to focus the light through the PEM, e.g., particularly if light outside the IR range is used.

Figure 9A:
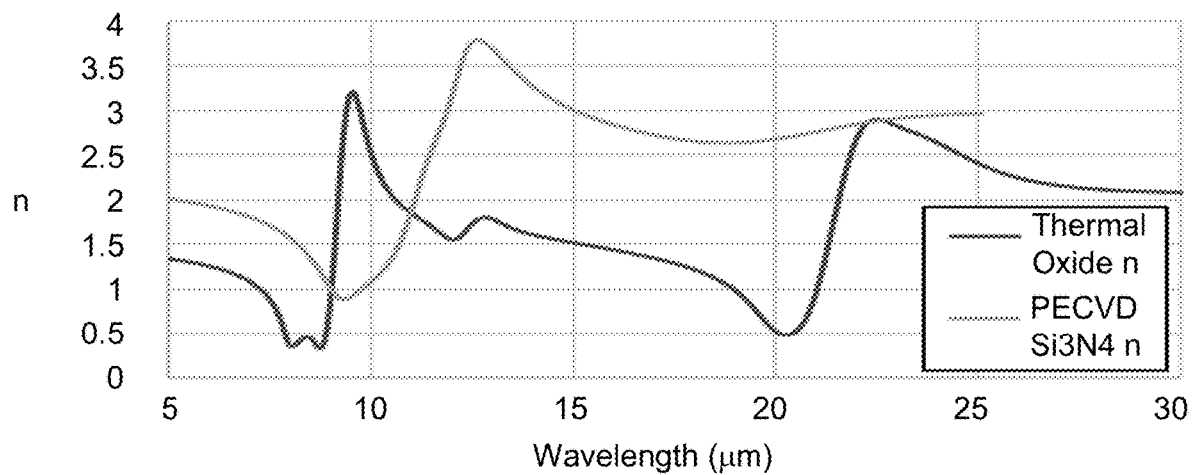
FIGS. 9A and 9B illustrate the real and imaginary components, respectively, of the refractive index for thermal oxide and silicon nitride.
Figure 9B:
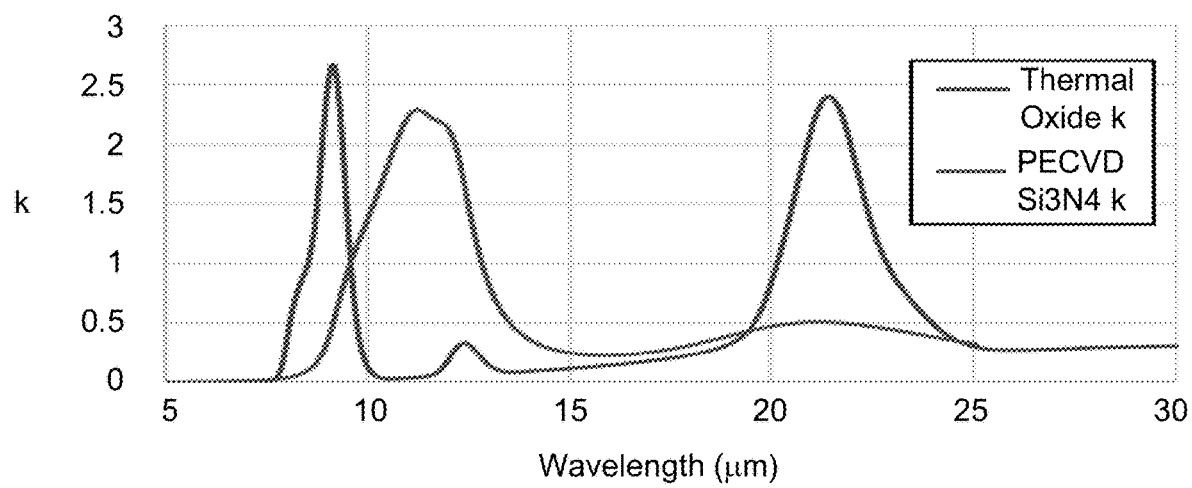

With the use of a tunable light source 110, the data acquisition and sampling with the optical metrology device may be optimized for targeted applications. For example, a sample specific data set requirement may be established such that unnecessary wavelength acquisition steps are skipped, thereby streamlining measurement time. This may be illustrated through the inspection of the dispersion curves for commonly used materials in target applications. For example, FIGS. 9A and 9B illustrate the real and imaginary components, respectively, of the refractive index for thermal oxide and silicon nitride. As can be seen, the regions with large values for the absorption coefficients for these materials overlap from 8.5 μm to 10 μm, but are different outside of that range. Accordingly, for a specific application where the sample is mostly silicon nitride, the 8.5 μm to 15 μm region can be ignored, while for a thermal oxide dominated sample, the 8 μm to 10 μm and 11.5 μm to 13 μm regions may be excluded.

Assuming, the light source 110 may sequentially produce light with a single wavelength at a time and there is a single detector 150, the lower limit of the measurement time is a function of the number of wavelengths to be used and the rate of tuning the light source 110. Technically, this time may be multiplied by a value greater than one which accounts for the non-zero instrumentation time constant. The sequential nature of the data collection allows a user to collect as little or as much data as required with the operational range of the light source 110 allowing both broad (slow) and narrowly targeted (fast) measurements. While the data analysis is otherwise the same, with the use of multiplexing as illustrated in FIG. 5, the measurement time may be increased by collecting at multiple wavelengths simultaneously.

The detector 150 generates a plurality of output signals from the detected light that is received by the processor 160. The output signals are indicative of a response of the sample 101 to the obliquely incident light on the sample 101. Using the output signals, a characteristic of the sample may be determined. By way of example, the output signals from the detector 150 may be monitored to extract the DC value, as well as the 1st and 2nd harmonic at the PEM modulation frequency in the case of a single PEM modulator, and the sum and difference frequencies of the two modulators, as well as the twice the sum and difference frequencies in the case of two PEM modulators. The non-zero frequency signals may be monitored through a digital or analog lock-in-amplification (LIA) process with transimpedance amplifier 151. If desired, a mechanical optical chopper 192 in the beam path allows the measurement of the DC signal to be made by LIA as well. If no mechanical chopper is used, a digital multimeter and appropriate signal isolation and digital or analog low-pass filters may be used. The time constant of the lock-in implication scheme will be set by the signal to noise ratio of the system. For a multi-modulator system, additional demodulators may be used, which may be inside the transimpedance amplifier 151 for LIA, to provide more than one channel, e.g., where there are three signals, there may be three separate single channel LIAs or one 3 channel LIA. The frequency range of the operation of the PEMs 174 and 176 makes the use of a Field-Programmable Gate Array (FPGA) a good approach for simplifying the instrumentation of the transimpedence amplifier 151 and enabling a direct manner of scaling system complexity without increasing hardware.

The detector 150 may be coupled to at least one processor 160, such as a workstation, a personal computer, central processing unit or other adequate computer system, or multiple systems. It should be understood that one processor, multiple separate processors or multiple linked processors may be used, all of which may interchangeably be referred to herein as processor 160, at least one processor 160, one or more processors 160. The processor 160 is preferably included in, or is connected to or otherwise associated with optical metrology device 100. The processor 160, for example, may control the positioning of the sample 101, e.g., by controlling movement of a stage 109 that is coupled to the chuck. The stage 109, for example, may be capable of horizontal motion in either Cartesian (i.e., X and Y) coordinates, or Polar (i.e., R and θ) coordinates or some combination of the two. The stage may also be capable of vertical motion along the Z coordinate. The processor 160 may further control the operation of the chuck 108 to hold or release the sample 101. The processor 160 may also collect and analyze the data obtained from the detector 150 as discussed herein. For example, the processor 160 may analyze the data to determine one or more physical characteristics of the sample 101 as discussed below. The processor 160, which includes at least one processing unit 162 with memory 164, as well as a user interface including e.g., a display 166 and input devices 168. A non-transitory computer-usable storage medium 169 having computer-readable program code embodied may be used by the processor 160 for causing the at least one processor to control the optical metrology device 100 and to perform the functions including the analysis described herein. The data structures and software code for automatically implementing one or more acts described in this detailed description can be implemented by one of ordinary skill in the art in light of the present disclosure and stored, e.g., on a computer-usable storage medium 169, which may be any device or medium that can store code and/or data for use by a computer system such as processing unit 162. The computer-usable storage medium 169 may be, but is not limited to, flash drive, magnetic and optical storage devices such as disk drives, magnetic tape, compact discs, and DVDs (digital versatile discs or digital video discs). A communication port 167 may also be used to receive instructions that are used to program the processor 160 to perform any one or more of the functions described herein and may represent any type of communication connection, such as to the internet or any other computer network. The communication port 167 may further export signals, e.g., with measurement results and/or instructions, to another system, such as external process tools, in a feed forward or feedback process in order to adjust a process parameter associated with a fabrication process step of the samples based on the measurement results. Additionally, the functions described herein may be embodied in whole or in part within the circuitry of an application specific integrated circuit (ASIC) or a programmable logic device (PLD), and the functions may be embodied in a computer understandable descriptor language which may be used to create an ASIC or PLD that operates as herein described.

The raw output of the optical metrology device 100 is a spectra of voltage values versus wavelength set point on, e.g., light source 110. In the case of use of a single PEM 174 or 176, the voltage values are recorded from LIA and are referred to as the DC (chopper frequency), 1F (PEM frequency), and 2F (second harmonic of the PEM frequency) signals. The LIA measure the root mean squared voltage, the chopper halves all signals, and the chopper is a square wave. The measured voltage from the lock in amplifier for DC amplification is multiplied by correction factor, e.g., π/4, because the DC signal is a square wave and the lock-in only extracts the first component. Hence, two to three demodulations are required depending on whether optical chopper 192 is present used. Depending on the orientation of the optical axis of the polarizing components, the spectra can be used to calculate ellipsometric values N, C and S. If one takes the plane of incidence to be the 0-degree angle direction with rotation clock wise while observing the sample from the source direction being positive, the simplest embodiment of the calculation for the configuration of first polarizer at 45°, PEM at 90°, and analyzing polarizer at +45° is:

$$S = 1F/2/J1/DC \qquad \text{eq. 3}$$

$$C = -2F/2/J2/DC \qquad \text{eq. 4}$$

$$N = \sqrt{1 - S^2 - C^2} \qquad \text{eq. 5}$$

where J1 and J2 are the Bessel functions of the first kind, such that J1=J1(A), and J2=J2(A), where A=2.4048 rad. A plurality of output signals may be generated in this manner, wherein the output signals are indicative of the sample reflection 114, e.g., the response of the sample to the light that is obliquely incident on the sample, including the top surface 102 and buried structures 103, but not including the back side reflection 118, from which the desired characteristic of the sample, such as a characteristic of the buried structure 103, may be determined.

Figure 10:
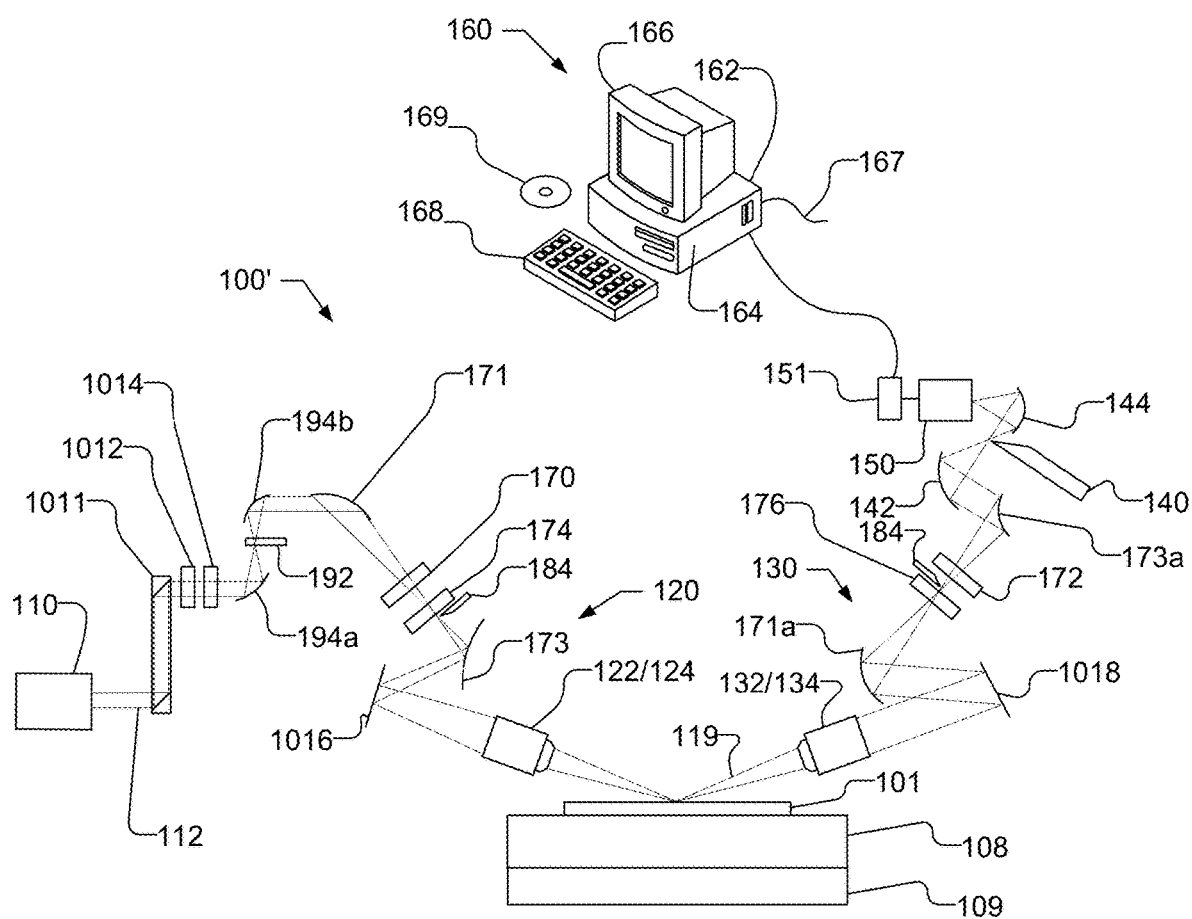
FIG. 10 illustrates a more detailed schematic view of an optical metrology device configured to perform measurements of a sample that is at least partially transparent to the spectral range of light used by the optical metrology device.

FIG. 10 illustrates a more detailed schematic view of an optical metrology device 100' that is similar to optical metrology device 100, shown in FIG. 1, like designated elements being the same, but that includes additional components, as described.

As illustrated, optical metrology device 100' may include a periscope assembly 1011 after the light source 110. The periscope assembly 1011, for example, may include three flat mirrors that are used to bring the height of the light beam 112 into compliance with the optical plane of the system. The periscope assembly 1011 may also rotate the polarization of the light beam 112 by 45°, which is linearly polarized after leaving the light source 110. If the polarization of the light beam 112 is not rotated, there would be zero light incident on the sample 101, if the polarizer 170 is set to 90° implying that TE vs TM mode reflectivity could not be measured. By rotating the polarization in the periscope assembly 1011, that issue is resolved. Additionally, by rotating the polarization of the light beam 112 with the periscope assembly 1011, throughput of the light beam 112 through polarizer 170 is maximized, when polarizer 170 is 45°, which may be its default configuration.

Optionally, after the periscope assembly 1011, there may be two polarizers 1012 and 1014 in continuous rotation mounts. Polarizers 1012 and 1014 may be used to set the power of the light beam 112 in the optical metrology device 100'. For example, the first polarizer 1012 may be rotated to attenuate the power, while the second polarizer 1014 is set to 45° to ensure that the same polarization state is used in the optical metrology device 100'.

The optical chopper 192 may be located after the periscope assembly 1011 and polarizers 1012 and 1014. The beam 112 may be focused onto the chopper blade by a pair of matched off-axis parabolic mirrors 194a and 194b. The optical chopper 192 may be positioned normal to the plane of propagation of the beam 112 and the beam 112 may cross the optical chopper 192 blade at 90°. The position of the optical chopper 192 with respect to the plane of propagation of the beam, as well as the spot size at the blade of the optical chopper 192, relate to the nature of chopped intensity profile. The spacings in the wheel of the optical chopper 192 may be even and radial. With the spot being small relative to the spacing in the wheel, as achieved by focusing, enables the intensity profile to be a square wave which makes simplifies later mathematical analysis of the temporal convolution.

As illustrated, a reflective optical element 171, which may be, e.g., concave mirror 171, receives the light beam 112 and focuses the beam to a point near the back of the PEM 174. A second reflective optical element 173, which may be, e.g., convex mirror 173 receives the light 112 and expands the light after passing through the PEM 174. The second reflective optical element 173 may be convex, concave, flat, or may be removed, where the light may be received by mirror 1016 or objective 122/124. Thus, the concave mirror 171 serves the dual object of focusing the beam through the PEM 174 as well as expanding the beam thereafter so that the beam fills the entrance pupil of the objective 122/124. Expansion may be increased with convex mirror 173 with the objective of filling the objective 122/123, but convex mirror 173 may be removed, e.g., if there is sufficient distance for the beam to expand to fill the objective 122/124, or may be other wised used to direct or control the beam to the objective 122/124. If a PEM 174 is not used, reflective optical elements 171 and 173 may be flat mirrors or may be removed. A flat mirror 1016 may be positioned to direct the light beam 112 to a Schwarzschild objective 122/124.

A matching Schwarzschild objective 132/134 on the opposite side of the sample 101 receives the reflected light 119, and directs the light 119 to a flat mirror 1018. A reflective optical element 171a, which may be, e.g., concave mirror 171a, receives the light beam 119 and focuses the beam to a point near the back of the PEM 176. A second reflective optical element 173a, which may be, e.g., convex mirror 173a, receives the light 119 and directs the light after passing through the PEM 176. If desired, the second reflective optical element 173a may be convex, concave, flat, or may be removed, where the light will be then be received by lens 142. If a second PEM 176 is not used, reflective optical elements 171a and 173a may be flat mirrors or may be removed. Moreover, lens 142 and 144 may be matched off-axis parabolic mirrors. There may be additional off-axis parabolic mirrors after lens 144, e.g., to allow optical focus on detector 150. Additionally, there may be additional beam steering flat mirrors before the concave mirror before polarizer 170 and after analyzer 172.

Figure 11:
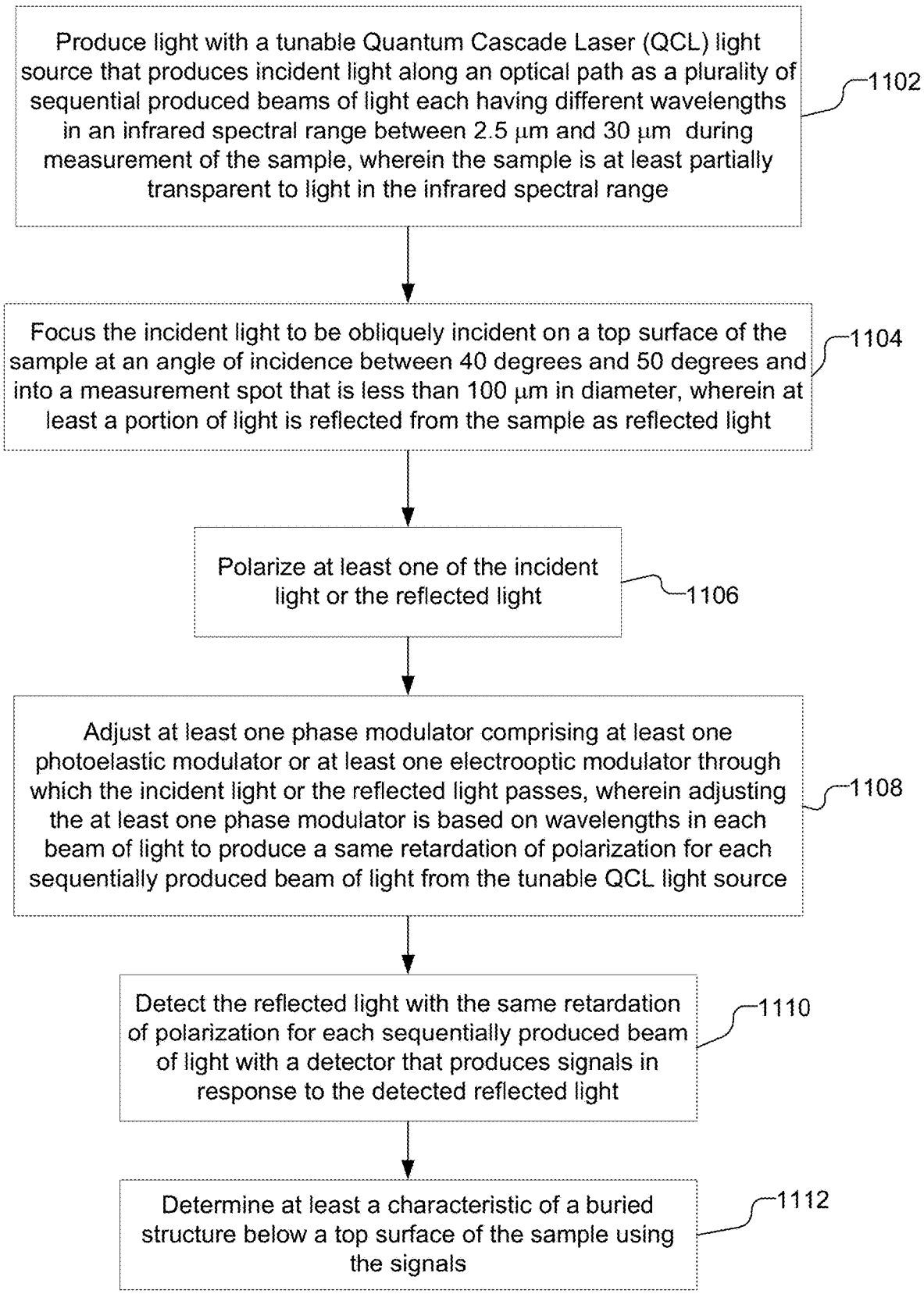
FIG. 11 is a flow chart illustrating a method of measuring a sample with an optical metrology device.

FIG. 11 is a flow chart illustrating a method of measuring a sample with an optical metrology device, which may be, e.g., a reflectometer, ellipsometer, or Mueller Matrix ellipsometer, as discussed herein. As illustrated in FIG. 10, light is produced light with a tunable Quantum Cascade Laser (QCL) light source, such as light source 110, that produces incident light along an optical path as a plurality of sequential produced beams of light each having different wavelengths in an infrared spectral range between 2.5 µm and 30 µm during measurement of the sample, wherein the sample is at least partially transparent to light in the infrared spectral range (1102). The incident light is focused, e.g., using reflective optical elements (Schwarzschild objective) 122/124, to be obliquely incident on a top surface of the sample at an angle of incidence between 40° and 50° and into a measurement spot that is less than 100 µm in diameter (e.g., between 35 µm and 70 µm), wherein at least a portion of light is reflected from the sample as reflected light (1104). At least one of the incident light or the reflected light is polarized, e.g., with polarizers 170, 172 (1106). At least one phase modulator, e.g., phase modulator 174, 176, is adjusted, the at least one phase modulator comprises at least one photoelastic modulator or at least one electrooptic modulator through which the incident light or the reflected light passes, wherein adjusting the at least one phase modulator is based on wavelengths in each beam of light to produce a same retardation of polarization for each sequentially produced beam of light from the tunable QCL light source (1108). The reflected light with the same retardation of polarization for each sequentially produced beam of light is detected with a detector, e.g., detector 150, that produces signals in response to the detected reflected light (1110). At least a characteristic of a buried structure below a top surface of the sample is determined using the signals, e.g., as discussed above and using equations 3-5 (1112).

In one implementation, the method may additionally include positioning the at least one phase modulator with respect to the optical path so that there is a non-zero angle between surface normal of an entrance surface through which the incident light or the reflected light enters the at least one phase modulator and the optical path; reducing internal reflection of the incident light or the reflected light from at least one of the entrance surface and an exit surface through which the incident light or the reflected light exits the phase modulator as a primary beam, wherein a secondary beam produced by internal reflection of the incident light or the reflected light in the phase modulator exits the exit surface displaced from the primary beam; and blocking at least a portion of the secondary beam from propagating along the optical path with a knife edge positioned with respect to the optical path. In one further implementation, the incident light or the reflected light is focused through the at least one phase modulator. In one implementation, focusing the incident light or the reflected light through the at least one phase modulator further comprises expanding the incident light to fill an entrance pupil of the reflective focusing optics used to focus the incident light to be obliquely incident on the top surface of the sample.

In one implementation, at least a second portion of light is transmitted through the sample and is reflected off a bottom surface of the sample producing back side reflected light, wherein reflected light from the sample comprises light reflected from the top surface and inside the sample and the back side reflected light that is physically displaced with respect to the light reflected from the top surface and inside the sample. The method may further include excluding the back side reflected light from being detected by the detector. For example, in one implementation, an image is produced of the light reflected from the top surface and inside the sample and the back side reflected light at a location along the optical path, and the back side reflected light is blocked from propagating along the optical path with a knife edge positioned at the location. For example, the location of the knife edge may be between the second set of focusing optics and the detector or at an entrance pupil of the detector. In another implementation, the detector is positioned so that the light reflected from the top surface and inside the sample is incident on one or more pixels of the detector and the back side reflected light is not incident on the one or more pixels of the detector.

In one implementation, polarizing at least one of the incident light or the reflected light may include polarizing the light that is obliquely incident on the sample with a polarizer and polarizing the reflected light with an analyzer.

In one implementation, adjusting at least one phase modulator may include adjusting a first phase modulator through which the incident light passes and adjusting a second phase modulator through which the reflected light passes.

Figure 12:
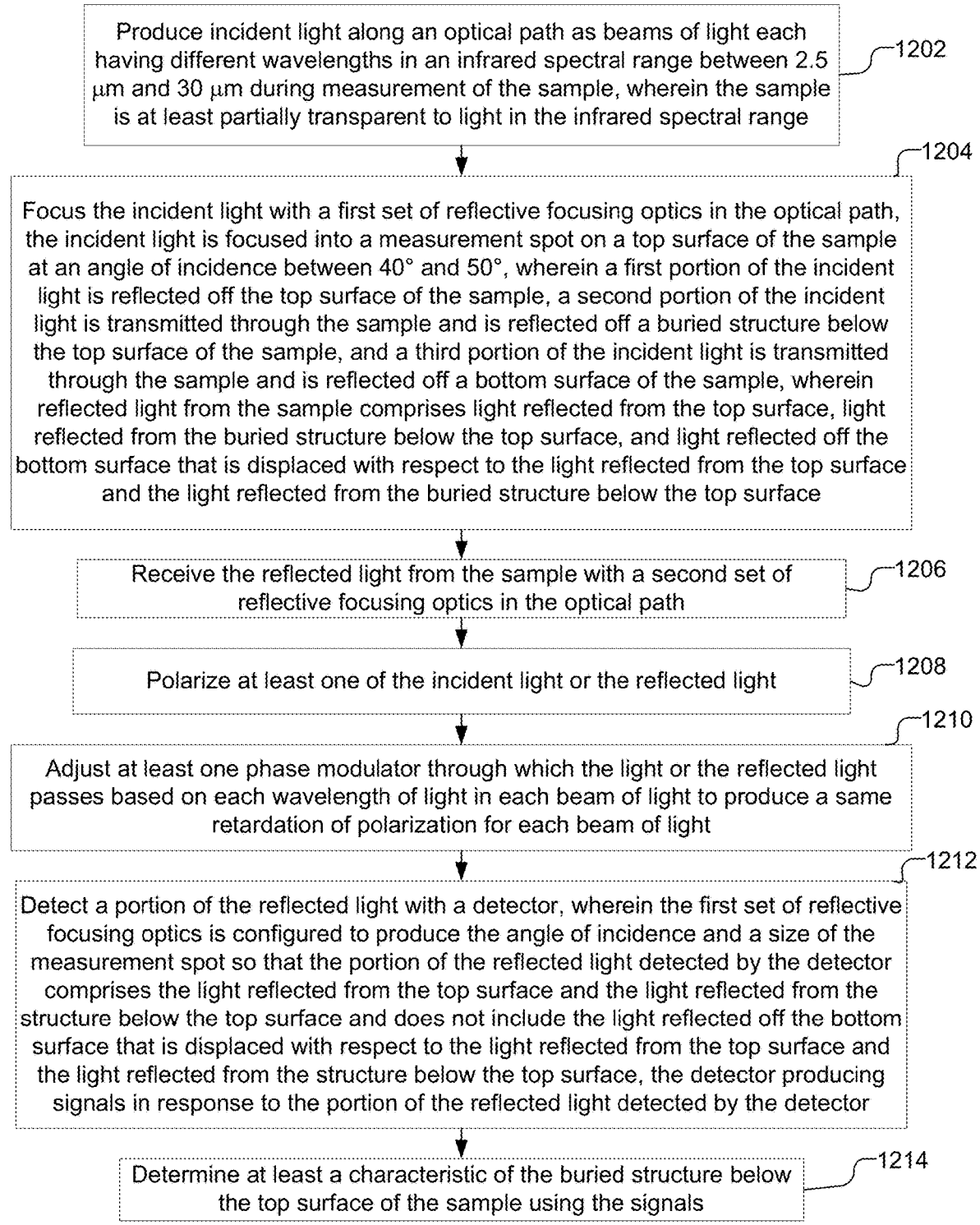
FIG. 12 is a flow chart illustrating another method of measuring a sample with an optical metrology device.

FIG. 12 is a flow chart illustrating another method of measuring a sample with an optical metrology device, which may be, e.g., a reflectometer, ellipsometer, or Mueller Matrix ellipsometer, as discussed herein. As illustrated, incident light is produced, e.g., using light source 110, along an optical path as beams of light each having different wavelengths in an infrared spectral range between 2.5 µm and 30 µm during measurement of the sample, wherein the sample is at least partially transparent to light in the infrared spectral range (1202). The incident light is focused with a first set of reflective focusing optics, e.g., using reflective optical elements (Schwarzschild objective) 122/124, in the optical path, the incident light is focused into a measurement spot on a top surface of the sample at an angle of incidence between 40° and 50°, wherein a first portion of the incident light is reflected off the top surface of the sample, a second portion of the incident light is transmitted through the sample and is reflected off a buried structure below the top surface of the sample, and a third portion of the incident light is transmitted through the sample and is reflected off a bottom surface of the sample, wherein reflected light from the sample comprises light reflected from the top surface, light reflected from the buried structure below the top surface, and light reflected off the bottom surface that is displaced with respect to the light reflected from the top surface and the light reflected from the buried structure below the top surface (1204). The reflected light from the sample is received with a second set of reflective focusing optics, e.g., reflective optical elements (Schwarzschild objective 132/134), in the optical path (1206). At least one of the incident light or the reflected light is polarized, e.g., with polarizers 170, 172 (1208). At least one phase modulator, e.g., phase modulator 174, 176, through which the light or the reflected light passes is adjusted based on each wavelength of light in each beam of light to produce a same retardation of polarization for each beam of light (1210). A portion of the reflected light is detected by a detector, e.g., detector 150, wherein the first set of reflective focusing optics is configured to produce the angle of incidence and a size of the measurement spot so that the portion of the reflected light detected by the detector comprises the light reflected from the top surface and the light reflected from the buried structure below the top surface and does not include the light reflected off the bottom surface, the detector producing signals in response to the portion of the reflected light detected by the detector (1212). At least a characteristic of the buried structure below the top surface of the sample is determined using the signals, e.g., as discussed above and using equations 3-5 (1214).

In one implementation, the light reflected from the structure below the top surface is displaced with respect to the light reflected from the top surface.

In one implementation, the method may include blocking the light reflected off the bottom surface from propagating along the optical path with a knife edge positioned with respect to the optical path so that the at least a portion of the reflected light received by the detector does not include the light reflected off the bottom surface. In a further implementation, the method may further include producing an image of the light reflected from the top surface and inside the sample and the light reflected off the bottom surface at a location along the optical path, wherein the knife edge is positioned with respect to the optical path at the location where the light reflected from the top surface and inside the sample and the light reflected off the bottom surface are imaged. The location of the knife edge may be between the second set of focusing optics and the detector or at an entrance pupil of the detector.

In one implementation, the method may include comprising positioning the detector so that the portion of the reflected light is incident on one or more pixels of the detector and the light reflected off the bottom surface is not incident on the one or more pixels of the detector.

In one implementation, polarizing at least one of the incident light or the reflected light may include polarizing the light that is obliquely incident on the sample with a polarizer and polarizing the reflected light with an analyzer.

In one implementation the at least one phase modulator comprises at least one photoelastic modulator or at least one electrooptic modulator or a rotating compensator.

In one implementation, the incident light is produced with a tunable Quantum Cascade Laser.

In one implementation, the method may include tuning a light source to sequentially produce light with different wavelengths in the infrared spectral range during measurement of the sample.

In one implementation, detecting the portion of the reflected light with the detector may include separating the reflected light into beams of varying monochromatic light having the same retardation of polarization, and separately detecting each beam of varying monochromatic light with a plurality of sub-detectors or a detector array.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:
1. An optical metrology device for measuring at least one characteristic of a sample, the optical metrology device comprising:
   a tunable light source that produces incident light along an optical path as a plurality of sequential produced beams of light each having different wavelengths in an infrared spectral range during measurement of the sample, wherein the sample is at least partially transparent to light in the infrared spectral range;
   a first set of reflective focusing optics that focuses the incident light to be obliquely incident on a top surface of the sample, wherein at least a portion of light is reflected from the sample as reflected light;
   at least one polarizing element that polarizes at least one of the incident light or the reflected light;
   at least one phase modulator comprising at least one photoelastic modulator or at least one electrooptic modulator through which the incident light or the reflected light passes, the at least one phase modulator is adjustable based on wavelengths in each beam of light to produce a same retardation of polarization for each sequentially produced beam of light from the tunable light source;

a detector that receives the reflected light with the same retardation of polarization for each sequentially produced beam of light and produces signals in response to the reflected light;

and at least one processor coupled to receive the signals from the detector, the at least one processor configured to determine at least a characteristic of a buried structure below the top surface of the sample using the signals.

2. The optical metrology device of claim 1, wherein each phase modulator in the at least one phase modulator comprises:

an entrance surface through which the incident light or the reflected light enters the phase modulator, wherein the phase modulator is positioned with respect to the optical path so that there is a non-zero angle between surface normal of the entrance surface and the optical path;

an exit surface through which the incident light or the reflected light exits the phase modulator as a primary beam, wherein a secondary beam produced by internal reflection of the incident light or the reflected light in the phase modulator exits the exit surface displaced from the primary beam;

an anti-reflective coating disposed on at least one of the entrance surface and the exit surface to reduce internal reflection of the incident light or the reflected light; and a knife edge positioned with respect to the optical path to block at least a portion of the secondary beam from propagating along the optical path.

3. The optical metrology device of claim 2, further comprising:

a reflective optical element that receives the incident light or the reflected light and focuses the incident light or the reflected light through the at least one phase modulator.

4. The optical metrology device of claim 1, wherein the tunable light source is a Quantum Cascade Laser (QCL) that produces light in an infrared spectral range between 2.5 µm and 30 µm and the first set of reflective focusing optics focuses the incident light on the top surface of the sample at an angle of incidence between 40° and 50° and into a measurement spot that is less than 100 µm in diameter.

5. The optical metrology device of claim 1, wherein at least a second portion of light is transmitted through the sample and is reflected off a bottom surface of the sample producing back side reflected light, wherein the reflected light from the sample comprises light reflected from the top surface and inside the sample and the back side reflected light that is physically displaced with respect to the light reflected from the top surface and inside the sample, wherein the back side reflected light is excluded from being received by the detector.

6. The optical metrology device of claim 5, further comprising:

a knife edge positioned with respect to the optical path to block the back side reflected light from propagating along the optical path to exclude the back side reflected light from being received by the detector.

7. The optical metrology device of claim 6, wherein the knife edge is positioned with respect to the optical path at a location where the light reflected from the top surface and inside the sample and the back side reflected light are imaged.

8. The optical metrology device of claim 7, further comprising a second set of focusing optics that receives the reflected light from the sample, wherein the location of the knife edge is between the second set of focusing optics and the detector or at an entrance pupil of the detector.

9. The optical metrology device of claim 5, wherein the back side reflected light is excluded from being received by the detector by positioning the detector so that the light reflected from the top surface and inside the sample is incident on one or more pixels of the detector and the back side reflected light is not incident on the one or more pixels of the detector.

10. The optical metrology device of claim 1, wherein the at least one polarizing element comprises a polarizer between the tunable QCL light source and the sample and an analyzer between the sample and the detector.

11. The optical metrology device of claim 10, wherein the at least one phase modulator comprises a first phase modulator between the polarizer and the sample and a second phase modulator between the sample and the analyzer.

12. A method for measuring a sample with an optical metrology device, the method comprising:

producing light with a tunable light source that produces incident light along an optical path as a plurality of sequential produced beams of light each having different wavelengths in an infrared spectral range during measurement of the sample, wherein the sample is at least partially transparent to light in the infrared spectral range;

focusing the incident light to be obliquely incident on a top surface of the sample, wherein at least a portion of light is reflected from the sample as reflected light;

polarizing at least one of the incident light or the reflected light;

adjusting at least one phase modulator comprising at least one photoelastic modulator or at least one electrooptic modulator through which the incident light or the reflected light passes, wherein adjusting the at least one phase modulator is based on wavelengths in each beam of light to produce a same retardation of polarization for each sequentially produced beam of light from the tunable light source;

detecting the reflected light with the same retardation of polarization for each sequentially produced beam of light with a detector that produces signals in response to the detected reflected light; and determining at least a characteristic of a buried structure below the top surface of the sample using the signals.

13. The method of claim 12, further comprising:

positioning the at least one phase modulator with respect to the optical path so that there is a non-zero angle between surface normal of an entrance surface through which the incident light or the reflected light enters the at least one phase modulator and the optical path;

reducing internal reflection of the incident light or the reflected light from at least one of the entrance surface and an exit surface through which the incident light or the reflected light exits the at least one phase modulator as a primary beam, wherein a secondary beam produced by internal reflection of the incident light or the reflected light in the phase modulator exits the exit surface displaced from the primary beam; and blocking at least a portion of the secondary beam from propagating along the optical path with a knife edge positioned with respect to the optical path.

14. The method of claim 13, further comprising:
focusing the incident light or the reflected light through the at least one phase modulator.

15. The method of claim 12, wherein the tunable light source is a Quantum Cascade Laser (QCL) that produces light in an infrared spectral range between 2.5 µm and 30 µm and the reflective focusing optics focus the incident light on the top surface of the sample at an angle of incidence between 40° and 50° and into a measurement spot that is less than 100 µm in diameter.

16. The method of claim 12, wherein at least a second portion of light is transmitted through the sample and is reflected off a bottom surface of the sample producing back side reflected light, wherein the reflected light from the sample comprises light reflected from the top surface and inside the sample and the back side reflected light that is physically displaced with respect to the light reflected from the top surface and inside the sample, the method further comprising excluding the back side reflected light from being detected by the detector.

17. The method of claim 16, wherein excluding the back side reflected light from being detected by the detector comprises:
producing an image of the light reflected from the top surface and inside the sample and the back side reflected light at a location along the optical path; and
blocking the back side reflected light from propagating along the optical path with a knife edge positioned at the location.

18. The method of claim 17, wherein the location of the knife edge is between a set of focusing optics that receives the reflected light from the sample and the detector or at an entrance pupil of the detector.

19. The method of claim 16, wherein excluding the back side reflected light from being detected by the detector comprises:
positioning the detector so that the light reflected from the top surface and inside the sample is incident on one or more pixels of the detector and the back side reflected light is not incident on the one or more pixels of the detector.

20. The method of claim 12, wherein polarizing at least one of the incident light or the reflected light comprises polarizing the light that is obliquely incident on the sample with a polarizer and polarizing the reflected light with an analyzer.

21. The method of claim 12, wherein adjusting at least one phase modulator comprises adjusting a first phase modulator through which the incident light passes and adjusting a second phase modulator through which the reflected light passes.

22. An optical metrology device for measuring at least one characteristic of a sample, the optical metrology device comprising:
a light source that produces incident light along an optical path, wherein the light source is tunable to produce beams of light each having different wavelengths in an infrared spectral range during measurement of the sample, wherein the sample is at least partially transparent to light in the infrared spectral range;
a first set of reflective focusing optics that obliquely focuses the incident light into a measurement spot on a top surface of the sample, wherein a first portion of the incident light is reflected off the top surface of the sample, a second portion of the incident light is transmitted through the sample and is reflected off a buried structure below the top surface of the sample, and a third portion of the incident light is transmitted through the sample and is reflected off a bottom surface of the sample, wherein reflected light from the sample comprises light reflected from the top surface, light reflected from the buried structure below the top surface, and light reflected off the bottom surface that is displaced with respect to the light reflected from the top surface and the light reflected from the buried structure below the top surface;
at least one polarizing element in the optical path that polarizes at least one of the incident light or the reflected light;
at least one phase modulator in the optical path and through which the incident light or the reflected light passes, the at least one phase modulator is adjustable based on wavelengths in each beam of light to produce a same retardation of polarization for each beam of light produced by the light source;
a detector that receives a portion of the reflected light, wherein the first set of reflective focusing optics is configured to produce an angle of incidence and a size of the measurement spot so that the portion of the reflected light detected by the detector comprises the light reflected from the top surface and the light reflected from the buried structure below the top surface, the detector produces signals in response to the portion of the reflected light detected by the detector; and
at least one processor coupled to receive the signals from the detector, the at least one processor configured to determine at least a characteristic of the buried structure below the top surface of the sample using the signals.

23. The optical metrology device of claim 22, wherein the light reflected from the buried structure below the top surface is displaced with respect to the light reflected from the top surface.

24. The optical metrology device of claim 22, further comprising:
a knife edge positioned with respect to the optical path to block the light reflected off the bottom surface from propagating along the optical path to so that the portion of the reflected light received by the detector does not include the light reflected off the bottom surface.

25. The optical metrology device of claim 24, wherein the knife edge is positioned with respect to the optical path at a location where the light reflected from the top surface and inside the sample and the light reflected off the bottom surface are imaged.

26. The optical metrology device of claim 25, further comprising a second set of focusing optics in the optical path that receives the reflected light from the sample, wherein the location of the knife edge is between the and the detector or at an entrance pupil of the detector.

27. The optical metrology device of claim 22, wherein the detector is positioned so that the portion of the reflected light is incident on one or more pixels of the detector and the light reflected off the bottom surface is not incident on the one or more pixels of the detector.

28. The optical metrology device of claim 22, wherein the at least one polarizing element comprises a polarizer between the light source and the sample and an analyzer between the sample and the detector.

29. The optical metrology device of claim 22, wherein the at least one phase modulator comprises at least one photoelastic modulator or at least one electrooptic modulator or a rotating compensator.

30. The optical metrology device of claim 22, wherein the light source is a tunable Quantum Cascade Laser that produces light in the infrared spectral range between 2.5 µm and 30 µm and the first set of reflective focusing optics focuses the incident light on the top surface of the sample at an angle of incidence between 40° and 50°.

31. The optical metrology device of claim 22, wherein during measurement of the sample, the light source is tuned to sequentially produce light with different wavelengths in the infrared spectral range.

32. The optical metrology device of claim 22, wherein the detector comprises:
a diffraction grating to separate the reflected light into beams of varying monochromatic light; and
a plurality of sub-detectors to separately receive each beam of varying monochromatic light having the same retardation of polarization or a detector array that separately receives each beam of varying monochromatic light having the same retardation of polarization at a different location on the detector array.

33. The optical metrology device of claim 22, wherein the optical metrology device is one of a reflectometer, ellipsometer, and Mueller Matrix ellipsometer.

34. A method for measuring a sample with an optical metrology device, the method comprising:
producing incident light along an optical path as beams of light each having different wavelengths in an infrared spectral range during measurement of the sample, wherein the sample is at least partially transparent to light in the infrared spectral range;
focusing the incident light with a first set of reflective focusing optics in the optical path, the incident light is focused into a measurement spot on a top surface of the sample, wherein a first portion of the incident light is reflected off the top surface of the sample, a second portion of the incident light is transmitted through the sample and is reflected off a buried structure below the top surface of the sample, and a third portion of the incident light is transmitted through the sample and is reflected off a bottom surface of the sample, wherein reflected light from the sample comprises light reflected from the top surface, light reflected from the buried structure below the top surface, and light reflected off the bottom surface that is displaced with respect to the light reflected from the top surface and the light reflected from the buried structure below the top surface;
polarizing at least one of the incident light or the reflected light;
adjusting at least one phase modulator through which the light or the reflected light passes based on each wavelength of light in each beam of light to produce a same retardation of polarization for each beam of light;
detecting a portion of the reflected light with a detector, wherein the first set of reflective focusing optics is configured to produce an angle of incidence and a size of the measurement spot so that the portion of the reflected light detected by the detector comprises the light reflected from the top surface and the light reflected from the buried structure below the top surface, the detector producing signals in response to the portion of the reflected light detected by the detector; and
determining at least a characteristic of the buried structure below the top surface of the sample using the signals.

35. The method of claim 34, wherein the light reflected from the buried structure below the top surface is displaced with respect to the light reflected from the top surface.

36. The method of claim 34, further comprising:
blocking the light reflected off the bottom surface from propagating along the optical path with a knife edge positioned with respect to the optical path so that the portion of the reflected light received by the detector does not include the light reflected off the bottom surface.

37. The method of claim 36, further comprising producing an image of the light reflected from the top surface and inside the sample and the light reflected off the bottom surface at a location along the optical path, wherein the knife edge is positioned with respect to the optical path at the location where the light reflected from the top surface and inside the sample and the light reflected off the bottom surface are imaged.

38. The method of claim 37, wherein the location of the knife edge is between a set of focusing optics that receives the reflected light from the sample and the detector or at an entrance pupil of the detector.

39. The method of claim 34, further comprising positioning the detector so that the portion of the reflected light is incident on one or more pixels of the detector and the light reflected off the bottom surface is not incident on the one or more pixels of the detector.

40. The method of claim 34, wherein polarizing at least one of the incident light or the reflected light comprises polarizing the light that is obliquely incident on the sample with a polarizer and polarizing the reflected light with an analyzer.

41. The method of claim 34, wherein the at least one phase modulator comprises at least one photoelastic modulator or at least one electrooptic modulator or a rotating compensator.

42. The method of claim 34, wherein the incident light is produced with a tunable Quantum Cascade Laser that produces light in the infrared spectral range between 2.5 µm and 30 µm and the first set of reflective focusing optics focuses the incident light on the top surface of the sample at an angle of incidence between 40° and 50°.

43. The method of claim 34, further comprising tuning a light source to sequentially produce light with different wavelengths in the infrared spectral range during measurement of the sample.

44. The method of claim 34, detecting the portion of the reflected light with the detector may comprise:
separating the reflected light into beams of varying monochromatic light having the same retardation of polarization; and
separately detecting each beam of varying monochromatic light with a plurality of sub-detectors or a detector array.

45. The method of claim 34, wherein the optical metrology device is one of a reflectometer, ellipsometer, and Mueller Matrix ellipsometer.

* * * * *